United States Patent
Eklund et al.

(10) Patent No.: US 6,229,467 B1
(45) Date of Patent: May 8, 2001

(54) CORRECTION STATIC ERRORS IN A/D-CONVERTER

(75) Inventors: Jan-Erik Eklund; Mikael Rudberg, both of Linköping (SE)

(73) Assignee: Telefonaktiebolaget LM Ericsson (publ) (SE)

(*) Notice: Subject to any disclaimer, the term of this patent is extended or adjusted under 35 U.S.C. 154(b) by 0 days.

(21) Appl. No.: 09/579,139

(22) Filed: May 30, 2000

(30) Foreign Application Priority Data

May 28, 1999 (SE) .................................................. 9902000

(51) Int. Cl.[7] ........................................................ H03M 1/10
(52) U.S. Cl. ...................... 341/120; 341/155; 340/347 CC
(58) Field of Search .................................... 341/120, 155, 341/158, 169, 139, 170, 112, 118, 116, 115, 164, 165; 340/347

(56) References Cited

U.S. PATENT DOCUMENTS 4,736,189 * 4/1988 Katsumata et al. .................. 340/347
5,777,569 * 7/1998 Naruki et al. ......................... 341/155

* cited by examiner

*Primary Examiner*—Brian Young
*Assistant Examiner*—John B. Nguyen
(74) *Attorney, Agent, or Firm*—Burns, Doane, Swecker & Mathis, L.L.P.

(57) ABSTRACT

An analog-to-digital converter (ADC) has a histogram based correction of static errors. In a control and calculating unit (23) of the converter thus the counts of uncorrected digital output codes are stored in a memory (51). From the stored counts a model distribution is determined in a calculation unit, e.g. by estimating an expected gaussian distribution. The model distribution is compared to the measured counts and relative errors of the counts are calculated, the relative errors indicating errors in coarse reference levels. The errors are used for calculating correction terms (L(A)) stored in a correction table (47). The correction terms are used by an output calculating unit (43') to calculate corrected, more accurate output codes. For a parallel ADC device having several cells, the histograms in the cells can be used to correct for gain and offset errors. Also, the histogram can be used in a built-in self test. A reference level generator can be only partially common to the cells in a parallel ADC providing accurate coarse levels without cross-talk.

38 Claims, 18 Drawing Sheets

Output code 01 10 = $6_{DEC}$

Output code 10 00 = $8_{DEC}$

Output code x = 01,
y = 110 => $8_{DEC}$

Output code x = 10,
y = 010 => $8_{DEC}$

10 Above

10 Below

—— Ideal
---- Typical measured

Code density

Code number i $V_A$ below code 10

$V_A$ above code 10

FIG. 12
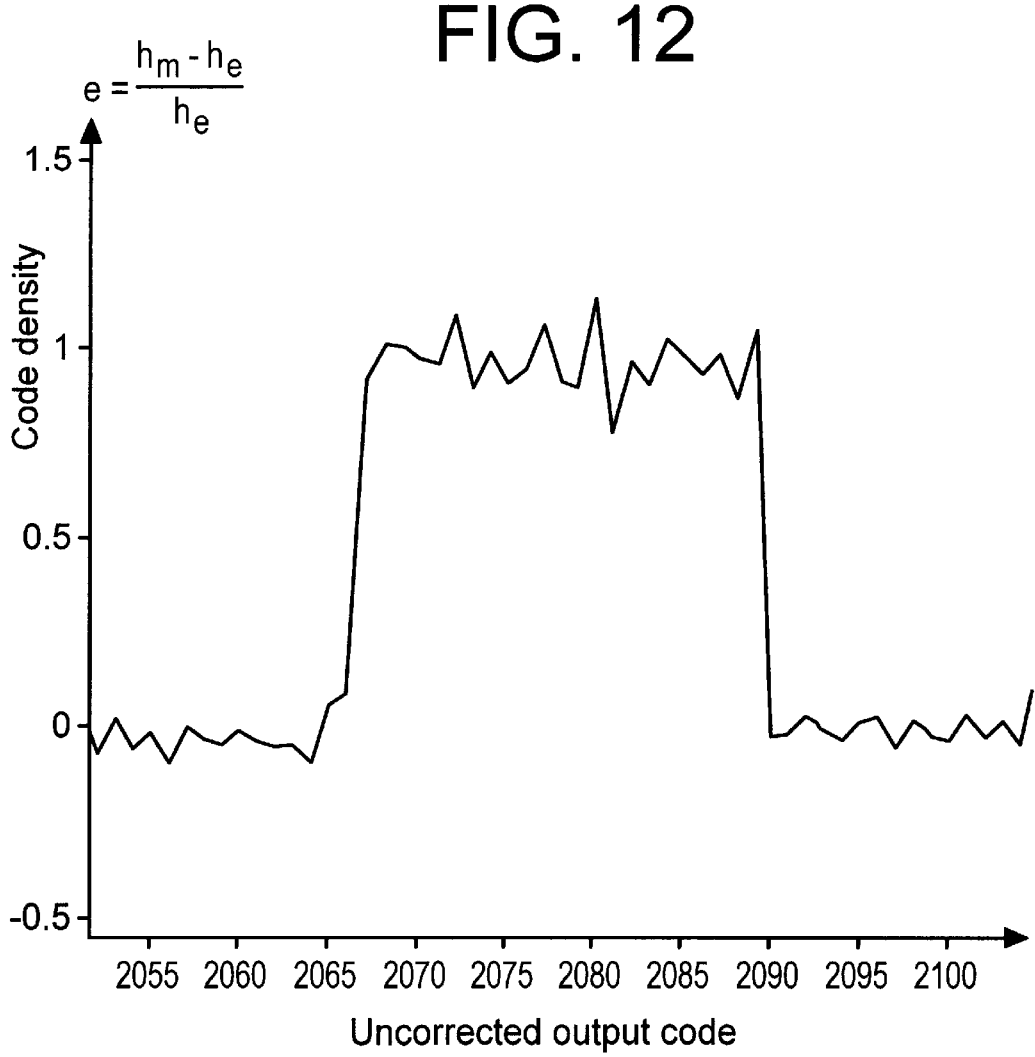
FIG. 13A
FIG. 13B
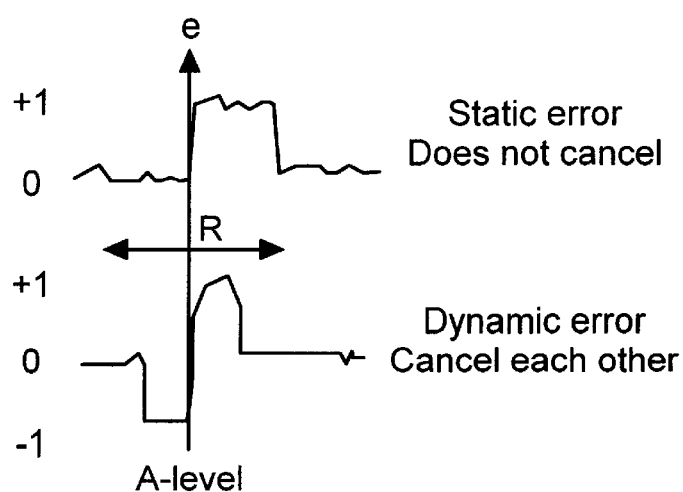

CORRECTION STATIC ERRORS IN A/D-CONVERTER

This application claims priority under 35 U.S.C. §§119 and/or 365 to 990200-0 filed in Sweden on May 28, 1999; the entire content of which is hereby incorporated by reference.

The present invention relates to correction of static errors in analog-to-digital converters using successive approximation procedures and to analog-to-digital converters, in particular to analog-to-digital converters having built-in error correction.

BACKGROUND

In wireless communication equipment incoming signals often have to be converted to a digital shape. Also, digital signals to be issued from the equipment often have to be converted to an analog shape. A schematic of a typical simple circuit used in such communication is illustrated in FIG. 1. An analog-to-digital converter (ADC) 1 is connected to an incoming line 5 and delivers digital data to a signal processor 9 which communicates with user circuits, not shown, to forward information thereto. In actual embodiments the ADC has a transfer function which always includes errors. The errors result in a degraded performance in terms of signal-to-noise ratio (SNR) and spurious free dynamic range (SFDR). In a typical application, the incoming line 5 is connected to some device 8 for radio frequency receiving which receives signals from an antenna 10.

Errors of one kind existing in the converting operation in an ADC are called static and are defined to be those errors which do not depend on the actual input signal to the ADC. These errors are approximately stable in time or change very slowly and will hereinafter be assumed to be permanent or constant in time. A typical example comprises matching properties.

The ADCs considered herein use a successive approximation procedure and are called SA-ADCs. Furthermore, they use binary search and subranging and in the subranging step redundant code is used, see Jan-Erik Eklund, "A/D conversion for sensor systems", Thesis, Linköpings Universitet, 1998, Jiren Yuan, Christer Svensson, "A 10-bit 5-MS/s Successive Approximation ADC Cell Used in a 70-MS/s ADC Array in 1.2 $\mu$m CMOS", IEEE Journal of Solid State Circuits, Vol. 29, No. 8, pp. 866–872, Aug. 1994, and "SPT7860, 10-BIT, 40 MSPS, 175 mW A/D CONVERTER", Data sheet, Jul. 24, 1996, Signal Processing Technology, Inc., 4755 Forge Road, Colorado Springs, Colo. 80907, USA.

SUMMARY

It is an object of the invention to provide an efficient digital error correction of an ADC, in particular of a parallel ADC, using no special trimming signals.

It is another object to provide methods and devices for correcting static mismatches in ADCs.

Thus a method of correcting, in the digital domain, static, in particular matching, errors in the analog domain is provided. In the method the following steps can be executed:

1. Measuring the actual histogram of the uncorrected digital values output from the ADC.
2. Estimating an expected histogram from the measured histogram.
3. Calculating the deviation of the measured histogram from the expected histogram.
4. Calculating a correction table based on the calculated deviation.
5. Correction output data by using values from the correction table to correct uncorrected data, e.g. adding the value to an uncorrected digital value.

Also, gain and offset errors in ADC cells in parallel ADCs can be corrected. An ADC is provided which has a reference level generator which gives a good stability of the generated coarse reference levels but still not requires too many components to provide the fine reference levels.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

While the novel features of the invention are set forth with particularly in the appended claims, a complete understanding of the invention, both as to organization and content, and of the above and other features thereof may be gained from and the invention will be better appreciated from a consideration of the following detailed description of non-limiting embodiments presented hereinbelow with reference to the accompanying drawings, in which:

FIG. 12 is a diagram illustrating calculated errors for an error of a coarse reference level, FIGS. 13a, 13b are graphs illustrating calculated errors for a static error of a coarse reference level and for a dynamical conversion error respectively.

DETAILED DESCRIPTION

Figure 1:
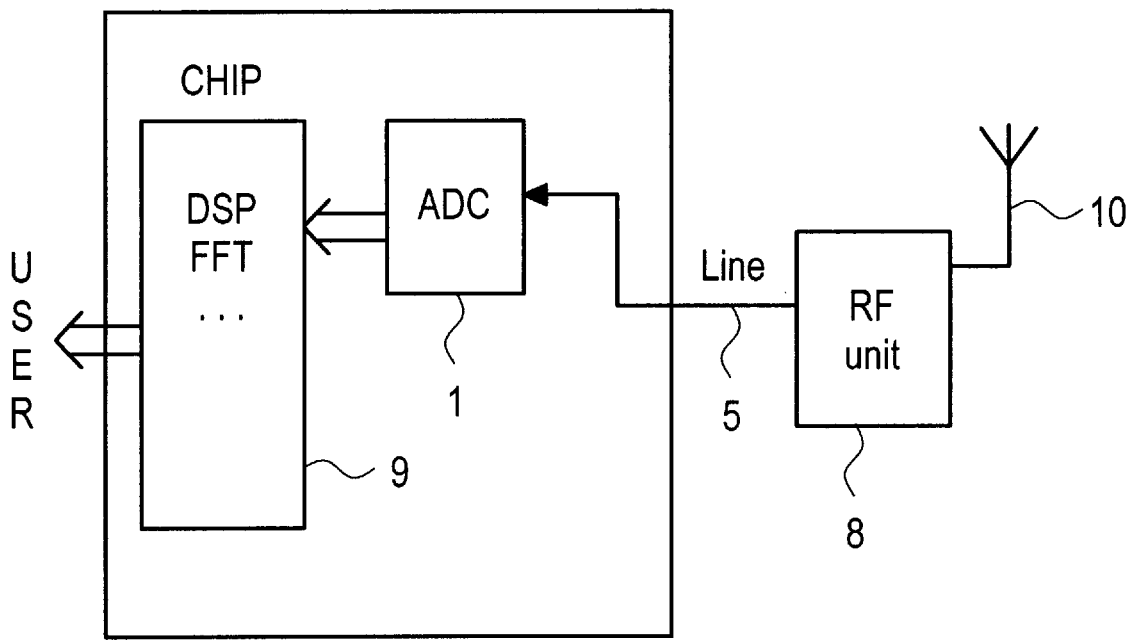
FIG. 1 is a schematic of devices for receiving radio signals.

An analog-to-digital converter using successive approximation (SA-ADC) can use a binary search method. Then a sample value, $V_S$, of an input signal is compared to a sequence of known reference values. The reference values are selected from a reference source having a plurality of output signals or reference levels. For the digital code x the output reference signal used in the comparison is $V_R(x)$, which typically is a voltage having the magnitude (x-Vunit) [V] where Vunit is a unit voltage. The sequence of reference signals used in searching the output code is determined by the binary search algorithm. The sampled value $V_S$ is first compared to the reference value in the middle of the search range, $V_R$(middle). The result from this comparison is the most significant bit (MSB) in the searched digital output word, which is the digital code x corresponding to a reference signal $V_R(x)$ deviating from the sampled value $V_S$ by the least possible amount. Depending on the result of the first comparison a new reference value is chosen. If $V_S < V_R$(middle), the result is MSB=0 and the next reference value to be compared to $V_S$ is lower than $V_R$(middle). If $V_S \geq V_R$(middle), the result is MSB=1 and the next reference value to be compared is higher than $V_R$(middle). The same comparison procedure is then repeated for the remaining bits in the search output word.

For a resolution of n-bits the number of required reference levels or values generally is $2^n$, which can be a quite high number. Then, a subranging technique can be used, see M. P. V. Kolluri, "A 12-bit 500 ns Subranging ADC", IEEE Journal of Solid State Circuits, Vol. 24, No. 6, Dec. 1989.

Figure 2:
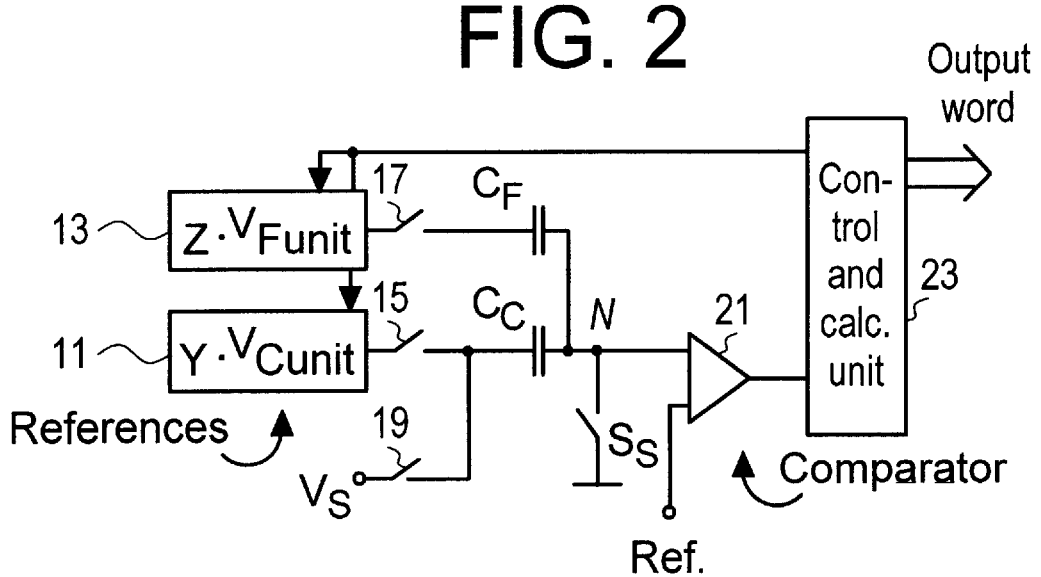
FIG. 2 is a circuit diagram of an ADC.

The total range of the signal $V_S$ to be converted is divided by using reference levels included in a coarse part $V_{RC}$ and a fine part $V_{RF}$ sequences of reference levels $V_{RC}(y)$ and $V_{RF}(z)$, one coarse reference level and one fine reference level being added to provide a "composite" reference level which is then compared to the sampled signal $V_S$, y and z being some order numbers of the reference levels. For an "equal" division the coarse and fine parts will have $2^{n/2}$ reference values each and thus the ADC has $2^{n/2+1}$ reference values. The algorithm is: Find integers y, z which minimize $$|V_S - (V_{RC}(y) + V_{RF}(z))| \quad (1)$$

or possibly: Find y, z which makes the difference $$V_S - (V_{RC}(y) + V_{RF}(z)) \quad (1')$$

have a positive value which is as small as possible.

y and z are selected to be integers corresponding to binary words comprising n/2 bits each and are thus both in the range of $[0, 2^{n/2}-1]$. The corresponding digital code is then $x = y \cdot 2^{n/2} + z$, and thus there are $2^n$ possible results. In order to make this work, the reference values $V_{RC}$ and $V_{RF}$ must be chosen correctly. In order to analyze the actual implementation a hardware oriented representation can be used: Find the y, z which minimize $$|V_S \cdot C_C - y \cdot V_{Cunit} \cdot C_C - z \cdot V_{Funit} \cdot C_F| \quad (2)$$

as derived from the circuit implementation shown in FIG. 2. There, reference generators 11, 13 deliver output reference voltages $y \cdot V_{Cunit}$ and $z \cdot V_{Funit}$ respectively through switches 15, 17 to capacitors $C_C$ and $C_F$. The sampled value $V_S$ is through a switch 19 connected to the capacitor $C_C$ at the electrode connected to the reference generator 11. The electrodes of the capacitors $C_C$, $C_F$ which are not connected to the respective reference generators 11, 13 are connected to each other at a node N, to ground through a switch $S_S$ and to one input of a comparator 21, to the other input of which some small reference voltage is applied. The output of the comparator 21 is connected to a control circuit 23 which controls the reference generators 11, 13 and the switches 15, 17, 19, $S_S$ and provides the searched digital output word x.

Figure 3A:
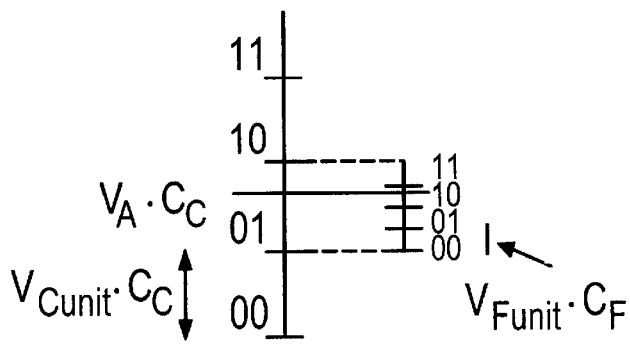
FIGS. 3a, 3b are diagrams illustrating subranging.
Figure 3B:
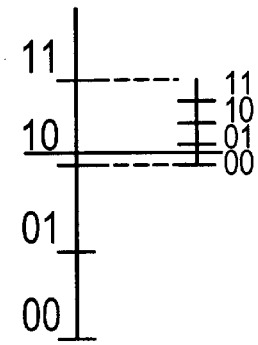

In the circuit of FIG. 2 Eq. (2) is implemented in the following way: Sample an analog value $V_S$ into the capacitors $C_C$, $C_F$ to get an electrical charge ($V_S \cdot C_C + 0 \cdot C_F$) in the node N. Subtract charges by applying the reference voltages to the capacitors $C_C$, $C_F$. When the charge generated by some reference voltage is approximately equal to the sampled charge at the node N, the correct reference levels have been found. The available reference charges are ($y \cdot V_{Cunit} \cdot C_C$) and ($z \cdot V_{Funit} \cdot C_F$). Examples of the subranging method are illustrated in FIGS. 3a, 3b.

Figure 4A:
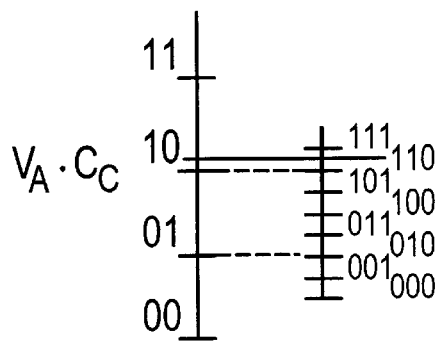
FIGS. 4a, 4b are diagrams illustrating redundant subranging.
Figure 4B:
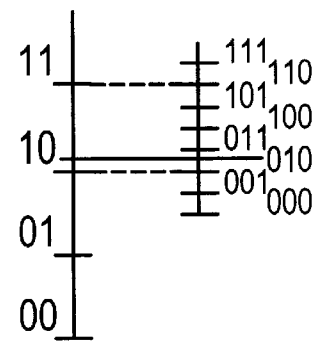

Also, redundant output code can advantageously be used in an SA-ADC, see the cited paper by M. P. V. Kolluri. The term redundant code means that for at least some levels of the value $V_S$ of the input sampled signal several possible output codes exist. The reason for introducing redundancy originally is the handling of dynamic errors during the conversion of the MSBs. However, the redundant code can be used for correcting static errors, as will be described hereinafter. The redundancy is achieved by letting the fine reference have more voltage levels than required, and thus making it cover a larger range than one coarse voltage unit, see FIGS. 4a, 4b. The resolution, i.e. the smallest distance between two levels of the finest reference source, is the same as in an ADC not using redundancy, but the output word is shorter, i.e. has fewer bits. In FIGS. 3b, 4a and 4b the results of the conversion for the same input level of $V_S$ are shown. The results should therefore be the same (=8). In FIGS. 4a and 4b two ways of obtaining this result are shown.

Consequently, a mistake can be allowed when calculating the two MSBs and still the correct value for the sampled value $V_S$ shown can be found. In FIG. 4a the MSBs should read $y=10_{BIN}$ but instead $y=01_{BIN}$ is found. The sequence of fine reference values between the codes $01_{BIN}$ and $10_{BIN}$ for y is prolonged into the region between $10_{BIN}$ and $11_{BIN}$ allowing the correct level to be found. In FIG. 4b the correct MSBs are found and the fine reference levels between the y-values $10_{BIN}$ and $11_{BIN}$ can be directly used.

The MSBs are called y and the LSBs z as above. These are then combined to a digital output code x:

$$x = 4 \cdot y + (z-2) = 100_{BIN} \cdot y + (z - 10_{BIN}) \qquad (3)$$

The value 4 indicates that 4 levels on the fine scale equals one level on the coarse scale. The value 2 is due to the negative overlap of two codes on the fine scale.

Figure 5A:
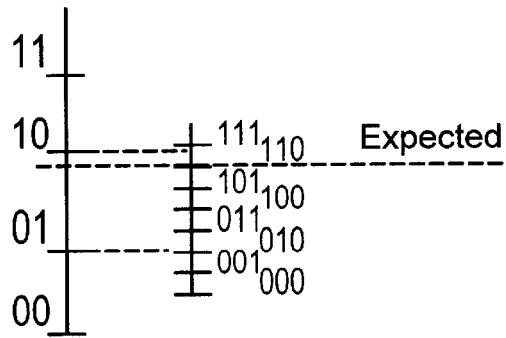
FIGS. 5a, 5b are diagrams illustrating redundant subranging for a too large and a too small step respectively between coarse reference levels.
Figure 5B:
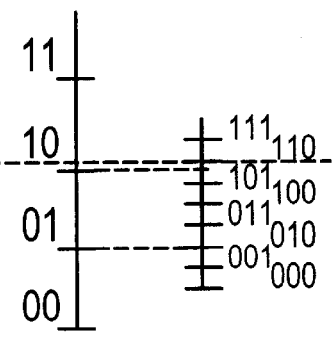

The generation of reference levels relies on matching passive components. First of all, the capacitors $C_C$ and $C_F$ must match what normally raises no severe problems since capacitors can be rather easily made with a high accuracy in integrated circuits. However, a sufficiently good matching of the voltage levels $V_{RC}(y) = y \cdot V_{Cunit}$ and $V_{RF}(z) = z \cdot V_{Funit}$ cannot be easily obtained. A simple and commonly used way of generating a high number of voltage levels is through voltage division in a resistor ladder comprising a plurality of resistors which all should have the same resistance value but the resistances of which actually have small deviations from said same resistance value. Each coarse voltage unit $V_{Cunit}(y) = V_{RC}(y+1) - V_{RC}(y)$ for the code y will then also have a small error and the level $V_{RC}(y)$ which should be equal to $y \cdot V_{Cunit}$ is $$\sum_{m=0}^{y-1} V_{Cunit}(m) = \sum_{m=0}^{y-1} (V_{Cunit} + V_\Delta(m)) \qquad (4)$$

where $V_\Delta(y)$ is an error in the voltage level for the code y. In FIG. 5a, the level 10 is above the expected value and in FIG. 5b it is below. The conversion of an input signal uses the actual level $V_{RC}(y)$, but the digital output x from the ADC represents the expected level.

The size or span of a reference level for a code y, i.e. the quantity $V_{Cunit}(y) = V_{Cunit} + V_\Delta(y) = V_{RC}(y+1) - V_{RC}(y)$, will influence the number of codes which occur in that level when converting an input signal having a more or less random shape to provide a large number of converted values. Thus, the size or span can be measured using statistical methods. A measure of the deviation of the size of a coarse reference level which can be calculated from such a measurement is called Differential Non-Linearity (DNL). In the measurement a test signal is applied as an input signal of the ADC and the histogram of the output codes is measured. For an input signal being a perfect sine wave having a swing corresponding to the conversion range the histogram will look like a bath tub, see FIG. 6. The histogram follows a smooth curve for an ideal ADC. However, due to the static matching errors, as e.g. derived from deviations of resistance values as discussed above, the histogram of output codes from any ADC will deviate from the ideal curve. The deviation or error is quantified by the DNL value for each code i as given by:

$$DNL(i) = (\#Measured(i) - \#Theoretical(i)) / \#Theoretical(i) \qquad (5)$$

Figure 7A:
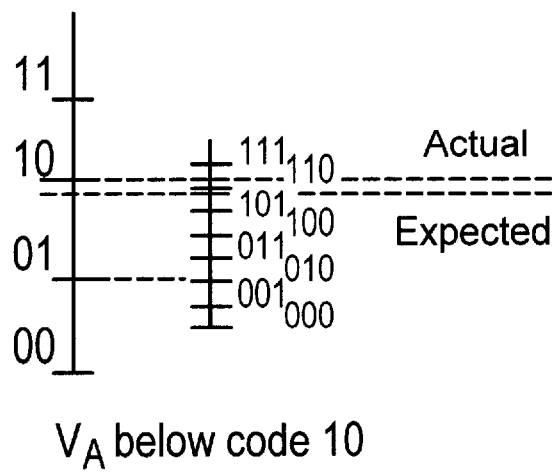
FIGS. 7a, 7b are diagrams illustrating redundant subranging for a too large step between two coarse reference levels and an input signal a little below and above respectively the higher one of the two coarse reference levels.
Figure 7B:
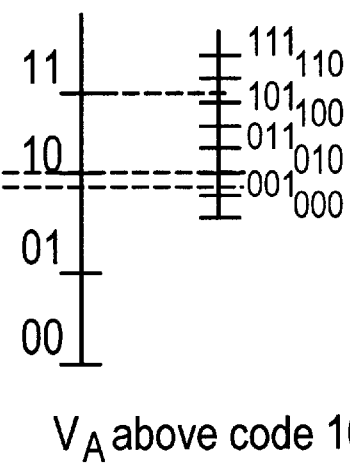

For the reference levels illustrated in FIG. 5a it is now assumed that the conversion of all bits are done correctly, and thus we obtain no situations like that illustrated in FIG. 4a. The level 10 in the coarse reference voltage suffers from a matching error. Depending on $V_S$, the fine reference levels $V_{RF}(z)$ are mapped between 01 and 10, see FIG. 7a, or between 10 and 11, see FIG. 7b. Ideally, the fine reference part of the output code should contain the codes $z=010_{BIN}$, $011_{BIN}$, $100_{BIN}$ or $101_{BIN}$. In FIG. 7a, however, a few output values can have the code $z=110_{BIN}$ for the fine part. The density of the code $110_{BIN}$ is a measure of the error in the coarse level $y=10_{BIN}$. In a similar way, the code density for the fine code $z=101_{BIN}$ is too small in FIG. 7b indicating that the distance between the coarse levels corresponding to the codes $y=10_{BIN}$ and $y=11_{BIN}$ is too short.

The analog-to-digital conversion gives a digital code. The digital code represents the true reference levels, which, due to matching errors, are unknown. The measured DNL information can be used for finding the interpretation of the output code and map the output code on a more convenient linear scale. By studying FIGS. 7a and 7b it is observed that the code $y=10_{BIN}$ should rather be $10.001_{BIN}$. This type of information can be used for adjusting all the codes to match their physical levels.

In a measurement an ADC having two subranging stages were used to give an output of 6 bits having 48 unique levels. The 3 MSBs and the 3 LSBs give 8 levels each. 6 of the 8 fine levels equal one coarse level. This can be compared to FIGS. 4a, 4b where 4 fine levels equal one coarse level. The digital output code x is found from:

$$x = 6 \cdot y + z \qquad (6)$$

The coarse reference has the range $[000_{BIN}, 111_{BIN}]$, and the fine reference has unique levels in the range $[001_{BIN}, 110_{BIN}]$. The codes $y=010_{BIN}$ and $z=111_{BIN}$ give the same output code as $y=011_{BIN}$ and $z=001_{BIN}$, that is 19.

Then the span of the fine reference voltage was changed from 1.8 V to 1.6 V in order to get a clearly visible mismatch. The result is a mismatch of the type illustrated in FIG. 7a. Since the sequence of fine reference values then is a little compressed, the code $z=111_{BIN}$ now represents unique analog values. The digital decoder as given by Eq. (6), however, does not take that into account. The result is a too high density for some codes, which is seen as peaks in the histogram of FIG. 8 for the codes 19, 25, 31 and 37.

Figure 9:
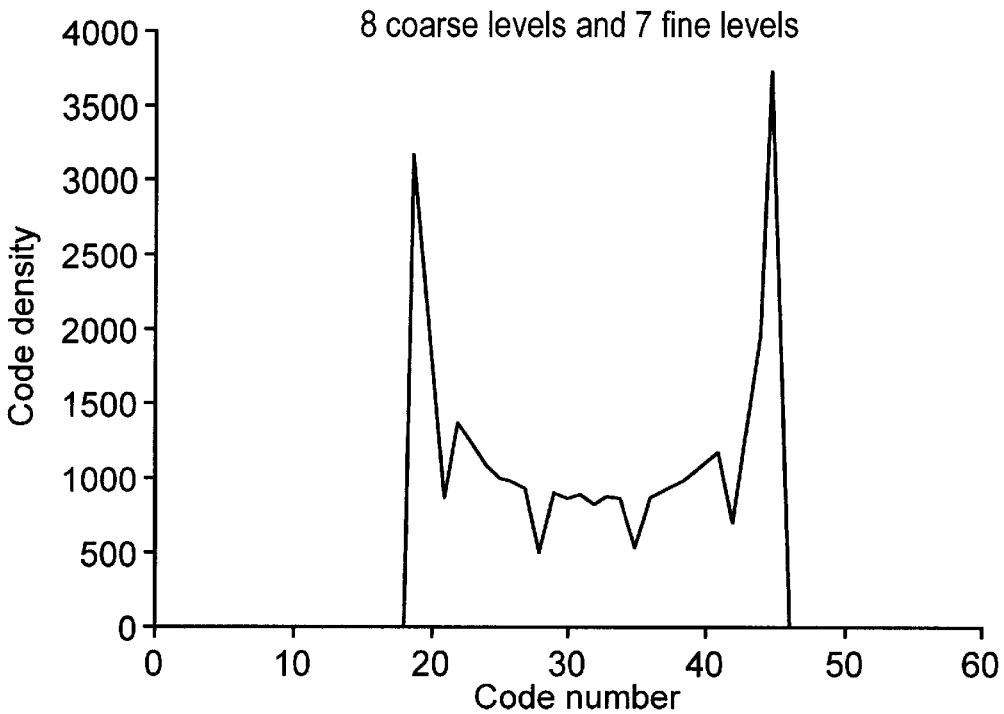
FIG. 9 is a simulated histogram of output codes for an ADC having a different static error.
Figure 10:
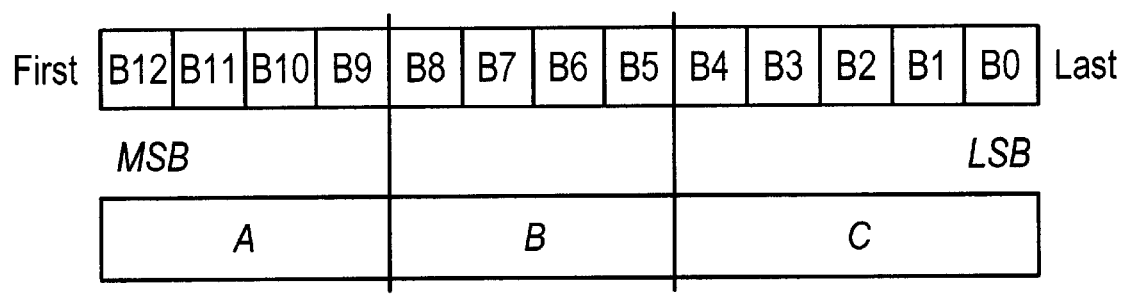
FIG. 10 is a schematic illustrating a subranging stages in a 13-bit ADC.

If the sequence of fine reference levels is instead changed to map to the sequence of coarse reference levels according to $$x = 7 \cdot y + z \qquad (7)$$

i.e. so that the 7 levels on the fine scale correspond to 1 coarse level, the resulting histogram is as shown in FIG. 9. A few codes occur too sparsely, i.e. the codes 21, 28, 35 and 42.

Figure 8:
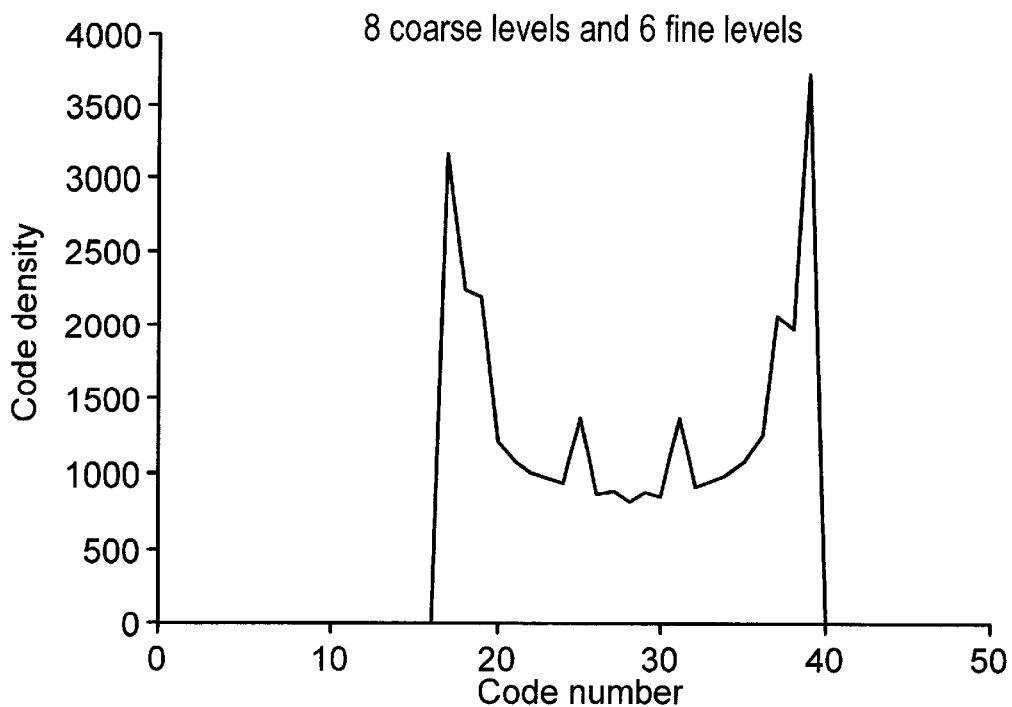
FIG. 8 is a simulated histogram of output codes for an ADC having a static error.

As seen in FIGS. 8 and 9, the DNL measurement shows that there is a mismatch. Although the mismatch in this case was forced from the outside, it is possible to use the DNL measurement for finding the internal mismatch. In the measured case all coarse levels have the same erroneous relation to the fine reference levels. In a real case, all levels in the sequence of coarse reference levels will have their own relation to the fine reference levels. To correct therefor a table listing correction values for each coarse reference level can be used.

In a somewhat more complicated but more realistic embodiment which will be discussed hereinafter the ADC has three subranging stages having 4, 4 and 5 bits respectively. The codes are redundant and the segmentation is made as is shown in FIG. 8. Consider the code blocks A, B and C corresponding to the subranging stages to be separate binary words comprising four, four and five bits respectively. These blocks must be weighted to be combined to one single digital word. The weight function is in this design:

$$D=(A\cdot 12+B)\cdot 12\cdot 2+C \quad (8)$$

where the actual codes from the stages are also called A, B and C and the result code to be delivered from the ADC is D. A and B are in the range of [0, 15] and C is in the range of [0, 31]. The output code D will be in the range of [0, 4619], i.e. a little more than 12 bits. There are several combinations of the codes A, B and C that give the same result D and also some combinations cannot occur. The 24 middle codes of C then correspond to the unit code interval of B and the 12 middle codes of B correspond to the unit code interval of A.

The actual output word D should have an offset as given by $$D=(A\cdot 12+(B-B_{offs}))\cdot 12\cdot 2+(C-C_{offs}) \quad (8')$$

The individual offsets of the subranging stages are here denoted by $C_{offs}$ and $B_{offs}$ and they are ideally equal to 4 to 2 respectively. The total offset is thus equal to 52. However, in the following description this total offset is not considered since it is only a subtraction of a constant.

The non-redundant output code would in this case by given by $$D=(A\cdot 16+B)\cdot 16\cdot 2+C \quad (9)$$

Since 12 is less than 16, the most significant bits has less weight in the redundant output code.

Each value of A, B and C is generated by some physical component, which has a matching error in accordance with the discussion above. The physical levels are named after the principle $V_A(x)$, where x is the code. $V_A$ without an argument generally refers to the group of physical levels related to A. Thus, $V_A(3)$ is the physical level corresponding to the digital output code A=3 (MSBs=$011_{BIN}$).

A matching having an error of about 0.1% can be achieved using an extremely careful layout of the physical components. However, this error is too large when the total output word comprises more than 10 bits as will be demonstrated hereinafter. The errors of the component values and thus the matching is, however, static or stationary and can be handled by means of statistic measurements as will now be described for the subranging stages of this example:

First, a word, P, is formed from the 9 LSBs (B and C stages) as a part of the ADC output signal according to Eq. (8):

$$P=B\cdot 24+C \quad (10)$$

The output word is then (not considering the digital offsets)

$$D=A\cdot 288+P \quad (11)$$

Figure 11:
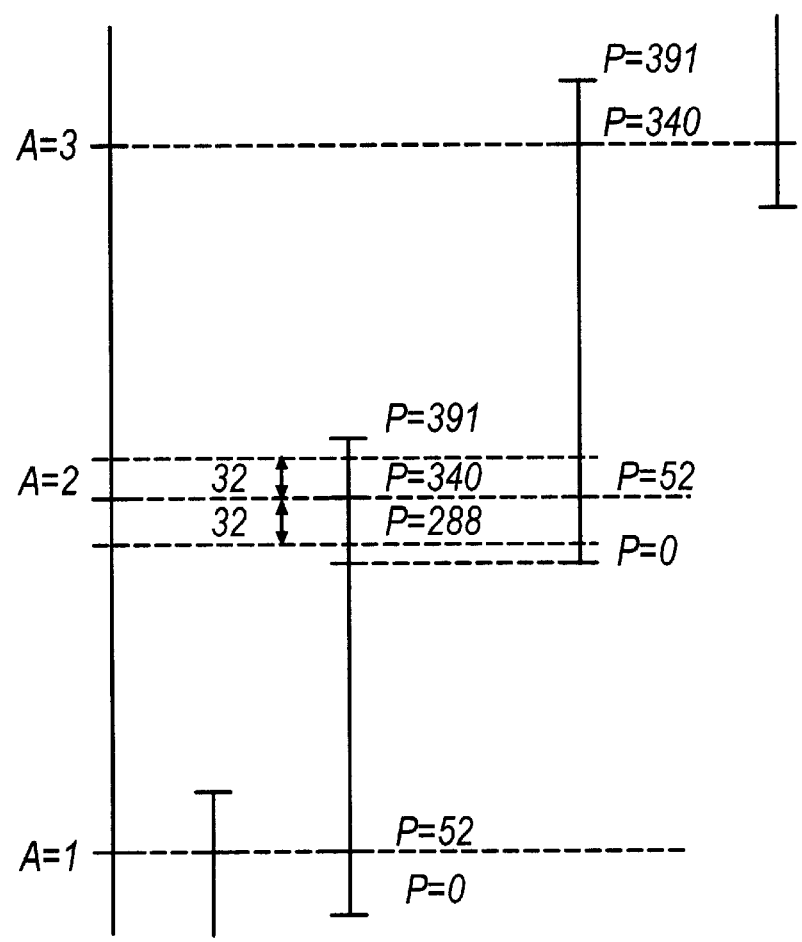
FIG. 11 is a diagram illustrating the calculation of output coded using the subranging stages of FIG. 10.

P is in the range of [0, 391] (15·24+31=391). The middle 288 (=12·24) codes of P correspond to those reference levels which are located within each step of $V_A$, i.e. between $V_A(x)$ and $V_A(x+1)$, and these codes are unique for each value of A, see FIG. 11. Each step in A thus has the same weight as 288 steps in the code P.

Owing to the redundancy, several combinations of A, B, C give the same output code D such as e.g.:

{A, B, C}={1, 13, 28}=>{A, P}={1, 340}=>D=628

{A, B, C}={2, 2, 4}=>{A, P}={2, 52}=>D=628

The accuracy of $V_P$ typically has to be better than 1 LSB. The matching requirement for $V_P$ is thus Matching__Error<1/288<0.35%, which can be achieved by a careful layout as has already been discussed. Thus the errors in $V_C(x)$ and $V_B(x)$ must not be considered. For an accuracy of $V_A$ better than 1 LSB, the matching requirements of $V_A$ is Matching__Error<1/4608<0.022% which cannot easily be achieved. Obviously, the requirements on $V_A$ must be higher than the requirements on $V_P$ since $V_A$ covers a larger signal range than $V_P$.

In correcting static errors the range formed by P or $V_P$ can be used for measuring the size of each step in $V_A$, i.e. the step or interval $\Delta_A(x)=V_A(x+1)-V_A(x)$. The correction is made when actually using the ADC and then some analog signal is fed to the ADC and is converted thereby to give a plurality of output digital values. For each output value D to be delivered by the ADC as computed using Eq. (11), there is one value for A and one value for P. The codes P for each value of A are sorted in one group. The values of P for A=3 are denoted by $P_{A=3}$ and so on. Thus, 16 different histograms are obtained, one for each group of $P_{A=x}$, x=0, 1, . . . , 15. If the step height $\Delta_A(x)$ is the same for all x, the histogram will, for a suitably chosen input analog signal, show that 288 different codes of $P_A$ are used since ideally $\Delta_A(x)=288\cdot\Delta_P$, where $\Delta_P$ is the unit step in P. If the step size $\Delta_A(x)$ is wrong for a code x, a different number of codes in $P_A$ will be used. The result from the measurement is used for creating a look-up table listing the true values for the codes of A. For a look-up table L(A) the ADC output is formed as $$D_{corrected}=L(A)+B\cdot 24+C=L(A)+P \quad (12)$$

where A is used as the address of a record in the look-up table L.

Assume that the step corresponding to $V_{A=2}$ is too wide and has an error of 0.28% of the total range. This corresponds to an error of 0.28%·16·288 LSB=13 LSB. In this case (288+13) codes in $P_{A=2}$ will be used provided that no dynamic errors exist. The correct digital range corresponding to the physical step $\Delta_{A=2}$ is thus $\Delta L(2)=L(3)-L(2)=304$. The correction table is then formed as:

L(0)=0

L(1)=ΔL(0)

L(2)=ΔL(0)+ΔL(1)

L(3)=ΔL(0)+ΔL(1)+304 . . .

Figure 6:
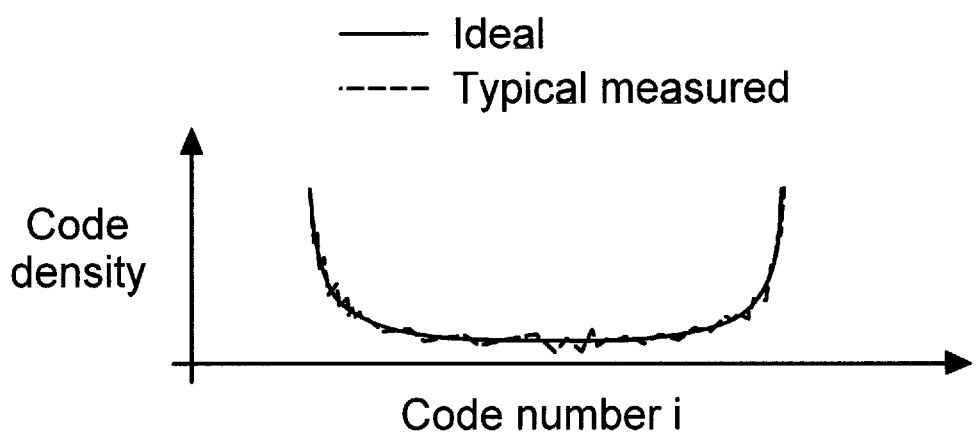
FIG. 6 is a graph illustrating the distribution of output codes for an input sine signal.

A non-uniform distribution of the codes obtained from the sampled values will generally exist owing to the shape of the input signal from which the samples are taken, see the bath tub curve of FIG. 6. Thus some input signal levels $V_S$ may be more common, resulting in that some output codes are more common. A solution to this problem would be to measure the histogram, $h_m$, of the output values from the ADC and compare it to the histogram of the input signal, i.e., the true histogram. The deviation will be a measurement of the error, which as above is called DNL (Differential Non-Linearity). However, the true histogram is not known. Instead thus, the existing information on the expected input signal must be used for making an intelligent estimate of the expected histogram, $h_e$.

$$h_e = f(h_m, \theta) \tag{13}$$

where $h_m$ is the measured histogram and $\theta$ is a quantity in some way characterizing the expected histogram. The parameters $\hat{\mu}$, $\hat{\sigma}$, N as defined below can for example be included in the quantity $\theta$.

A relative error e is then generally calculated as $$e = (h_m - h_e)/h_e \tag{14}$$

for each uncorrected output digital value. For a correct density, e=0. For too many codes, e>0, and for too little codes, e<0. The error e can then be used to create a correction table as will be described hereinafter.

In FIG. 12 a diagram is shown of the relative error e at a step of A. The diagram shows the error for output codes around A=6 and P=340, corresponding to D=2068 and A=7, P=52, compare FIG. 11, and shows that the relative error is approximately equal to zero except in a region above the step where it is equal to one for about 20 codes, i.e. up to about 2088. This means that the reference level $V_A(7)$ is too high and that the correct level is located at a level which is lower by a step corresponding to 20 fine levels, i.e. the levels of $V_C$ above, and that the output data must be corrected accordingly.

In the diagrams of 13a, 13b which are similar to the diagram of FIG. 12 but in a smaller scale, the first diagram shows the same case as in FIG. 12 with a level which is located too high. In the diagram of FIG. 13b the case for a dynamical conversion is illustrated. In that case there are errors deviating from zero at both sides of a shift of the coarse variable A. On one side of the shift there are errors equal to +1 and on the opposite side there are errors equal to −1. However, the total errors balance each other so that if the error is integrated or summed over the range R at the variable shift, a result equal to zero is obtained which is typical of dynamical errors. In actual cases there may be a combination of the cases illustrated in FIGS. 13a, 13b. The dynamical errors can always be eliminated by summing over a region at the shift. A positive sum of the errors then directly indicates that the corresponding reference level is too high and a negative sum that the reference level is too low. The absolute value of the sum gives the error of the reference level in the corresponding number of LSBs.

Estimating an expected histogram or generally determining an expected histogram will be described hereinafter. For some applications, a specific distribution of the output codes is expected. For example, for DMT-systems (Discrete Multi Tone) a gaussian distribution is expected. If the shape of the expected code density is assumed to be a gaussian distribution, the parameters ($\hat{\mu}$, $\hat{\sigma}$, N) of the distribution can be estimated from a sequence of uncorrected data, D(i):

$$\hat{\mu} = \frac{1}{N} \cdot \sum_{i=0}^{N-1} D(i) \tag{15}$$

$$\hat{\sigma} = \left[ \frac{1}{N} \cdot \sum_{i=0}^{N-1} (D(i) - \hat{\mu})^2 \right]^{1/2} \tag{16}$$

The estimated expected distribution is found from $$h_e(x) = \frac{1}{\hat{\mu} \cdot \sqrt{2 \cdot \pi}} \cdot e^{-\frac{(x-\hat{\mu})^2}{2\hat{\sigma}^2}} \tag{17}$$

for x=[0, 4711].

Figure 14:
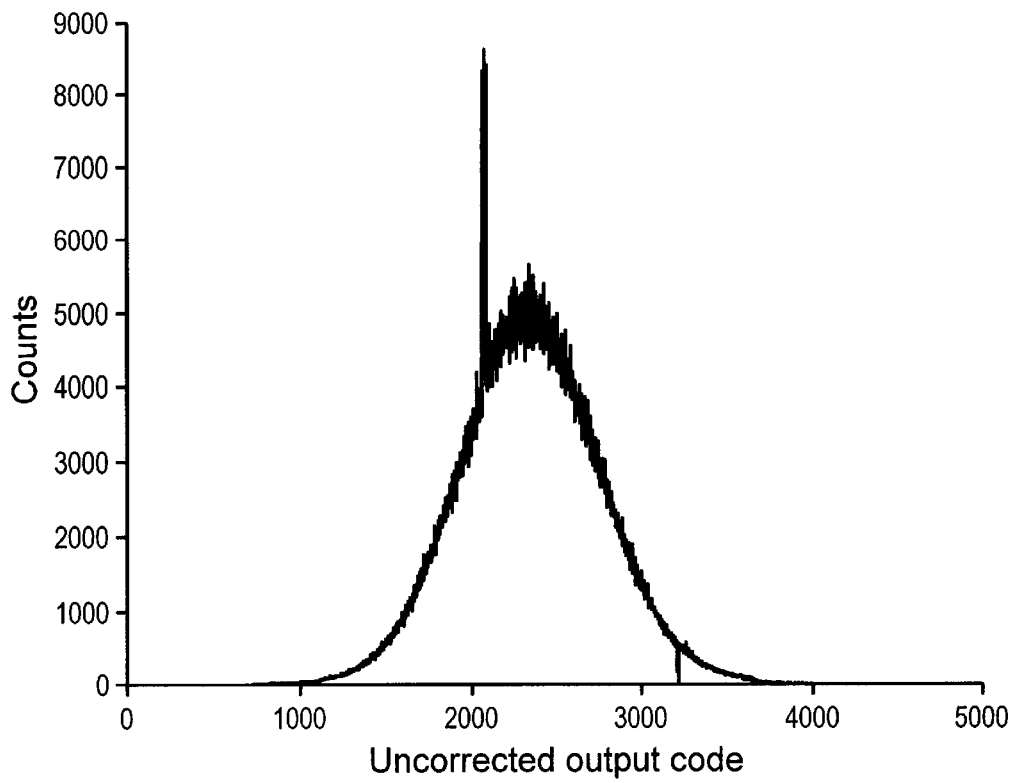
FIG. 14 is a graph illustrating a simulated histogram of an ADC having a static matching error of a coarse reference level.
Figure 15:
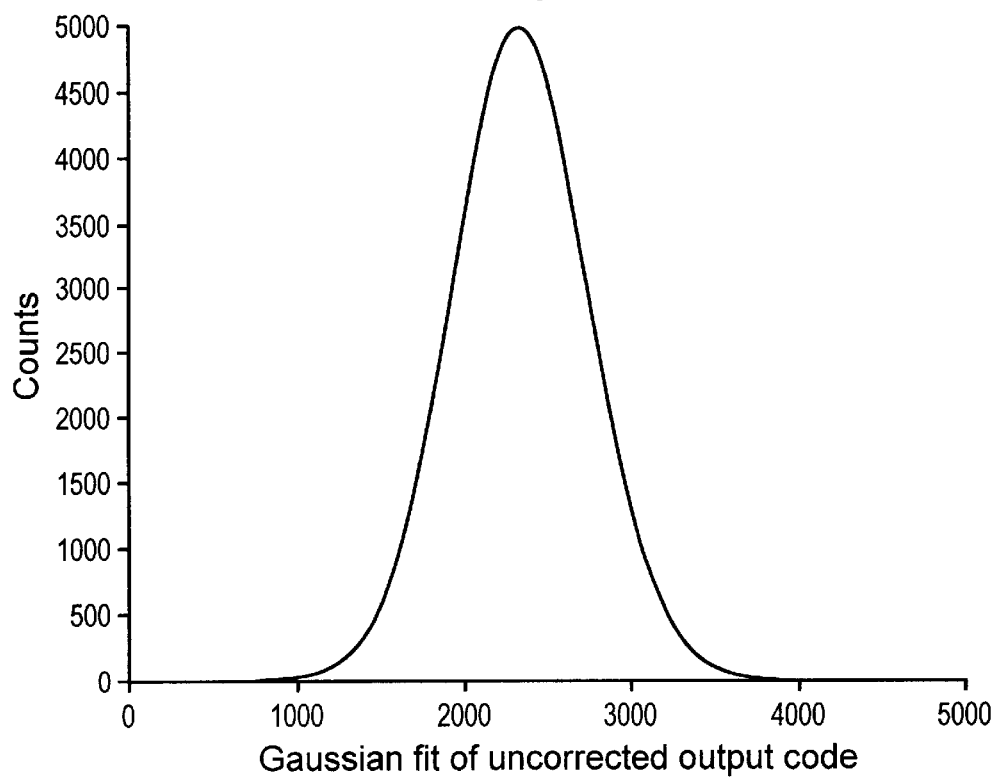
FIG. 15 is a graph illustrated an expected gaussian distribution estimated from the histogram of FIG. 14.

In FIG. 14 a simulated histogram is shown for a suitably chosen input analog signal. A level error as illustrated in FIG. 12 is assumed and the error is visible by the high counts corresponding to the level shift. A gaussian distribution estimated from the simulated histogram is plotted in FIG. 15.

Other expected shapes of the distribution of the output codes, e.g. a rectangular shape, can be estimated in a way similar to that described above using well known statistical methods. For some applications, the expected shape of the distribution may not be known such as can be the case for a general purpose ADC. In that case the expected histogram can be determined by low-pass filtering the measured histogram as will be described hereinafter. In such a filtering the mismatch errors which generally have a high frequency behavior will be removed or at least reduced.

Figure 16:
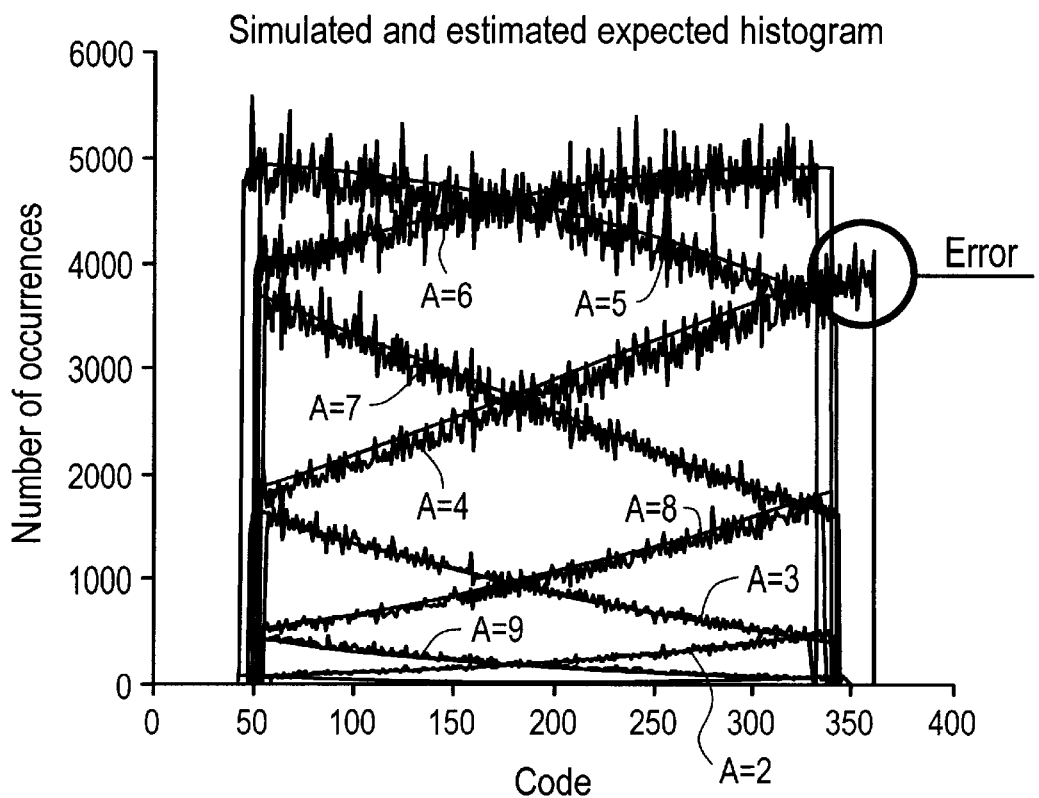
FIG. 16 is a graph illustrated simulated and expected histograms for an ADC having a matching error.
Figure 17:
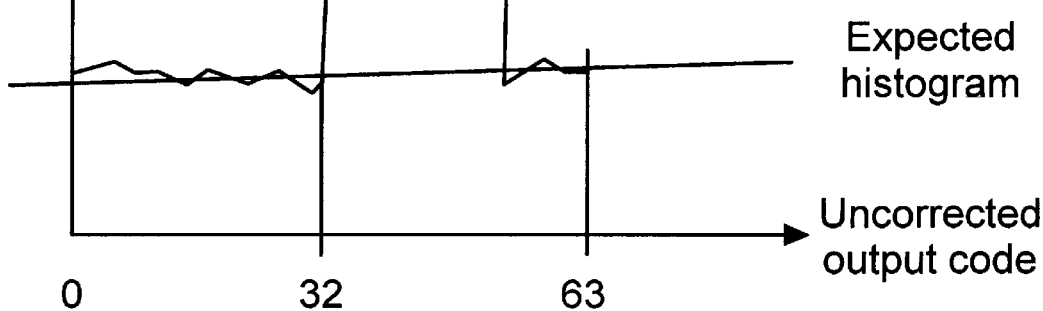
FIG. 17 is a graph illustrating the expected histogram of coarse reference level having an error.

Instead of using a total histogram partial histograms of the types illustrated in FIG. 16 which are determined for each value of A can be used and therefrom $P_A$ can be calculated. In FIG. 16 the input analog signal is assumed to produce samples having a mean $\hat{\mu}$ in the center of the conversion range and a suitable standard deviation $\hat{\sigma}$ to produce a near zero frequency at the borders of the conversion range. The smooth curve illustrates the ideal histogram for an ideal input signal giving a perfect gaussian distribution of sampled values and for an ideal ADC. The curve having noise or ripple illustrates a simulated histogram for a typical input signal and for some step errors in the A-conversion circuits. In FIG. 16 mainly the histograms for the middle eight A-values are visible since the histograms for the A-values [0, 1] and [10, 11] at the lower and upper boundary of the range are very small. As stated above, the codes [0, 51] and [340, 391] for P are not expected to be used, see FIG. 11. When they are still used in the actual conversion process as measured, this clearly signals a step error, or possibly a dynamical conversion error corrected by the redundancy feature, as is visible for the conversion block A=3.

As an example, correct the range $\Delta_{A=3}$, provided that the actual histogram and the expected histogram have been determined. An expected value, $H_e(A=3)$, of the occurrences of samples within a range at the border of an interval is found from the expected histogram, the range for example comprising 64 successive levels at the upper border:

$$H_e(A=3) = \Sigma h_e([(52+4 \cdot 288-32), (52+4 \cdot 288+32-1)])$$

where the sum is taken over all integer values in the range specified in the argument (corresponds to the range R above. The measured histogram value is the sum of the counts of the values in the same or corresponding range:

$$H_m(A=3)=\Sigma h_m([P_{A-3}=[391-52-32, 391-52+32] \& P_{A-4}=[0, 32-1+52]])$$

The correction term is then $$corr(A=3)=(H_m(A=3)-H_e(A=3))/H_e(A=3)$$

Thus, only 32 codes above and 32 codes below the expected height of A=3 are counted, i.e. at the level $V_A(4)$. The maximum allowed error in the coarsest reference levels $V_A(x)$, x=0, 1, . . . , 15 thus is the voltage corresponding to ±32 LSB.

Hence, assume a range within which the error in A is allowed, e.g. ±32 LSB. Add together the counts of the expected overlap of codes. The memory may then only contain counts for the 2·32+2·32 values around each step in A and based on these counts an estimated gaussian distribution can be determined. These memory addresses located both at the low border and the high border of P are numbered 0–63. If the step of A is too large, an increased count is found in the memory positions 32–63, compare FIG. 12. If the step of A is too small, a reduced count is found in the memory positions 0–31. In the determination of the gaussian distribution the histogram between these values at each interval upper border can be assumed to be e.g. a straight line between the histogram values at the ends of each interval, see FIG. 15, but also a direct estimation of the gaussian distribution can be made using standard statistical methods.

The expected histogram, $h_e$, can be found in an alternative way:

Assume that the error err(A) in A measured in bits is limited so that $$|(err(A)-288)|/288<0.25 \quad (18)$$

The number of codes in the range P=[123, 267] will then always be correct. The counts in these intervals are then used for estimating the expected histogram such as an estimated gaussian distribution. Alternatively the total counts in this range for the possible A-values can be calculated:

$$H_e(A)=\Delta h_m(P_A[123, 267]). \quad (19)$$

This gives 16 points on a curve. The intermediate values can be found by interpolation. These intermediate values are then directly used in the comparison to an appropriate number of counts at the steps in A. Alternatively the total curve or the 16 points may be used for estimating a some suitable distribution such as a gaussian distribution.

Figure 18:
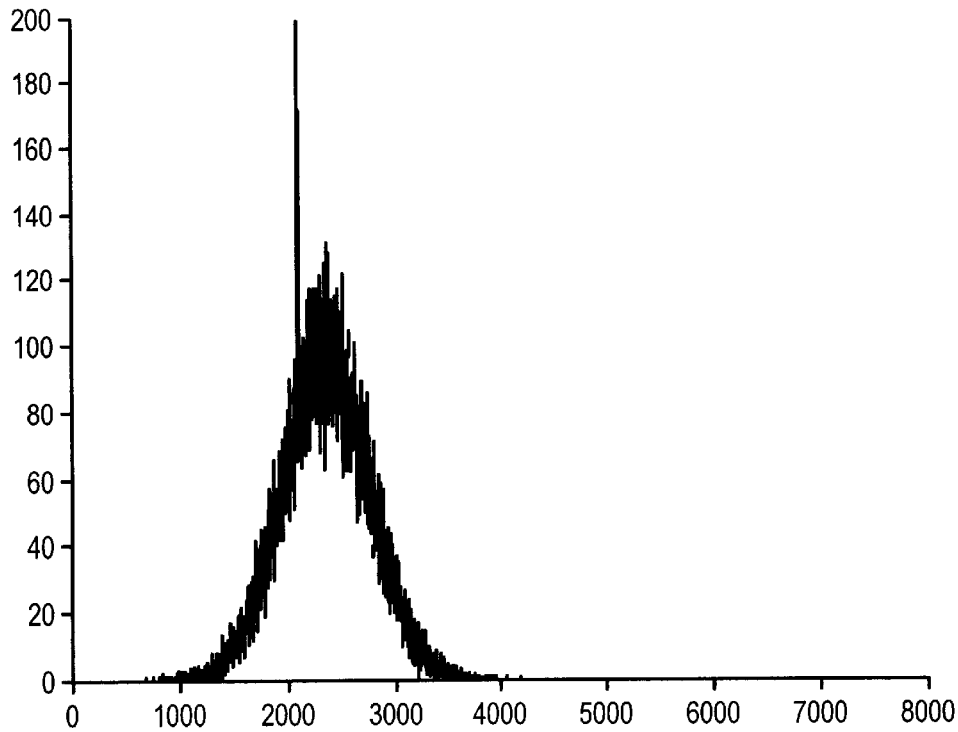
FIG. 18 is a graph illustrating a simulated histogram of an ADC having a static matching error of a coarse reference level similar to that of FIG. 14.
Figure 19:
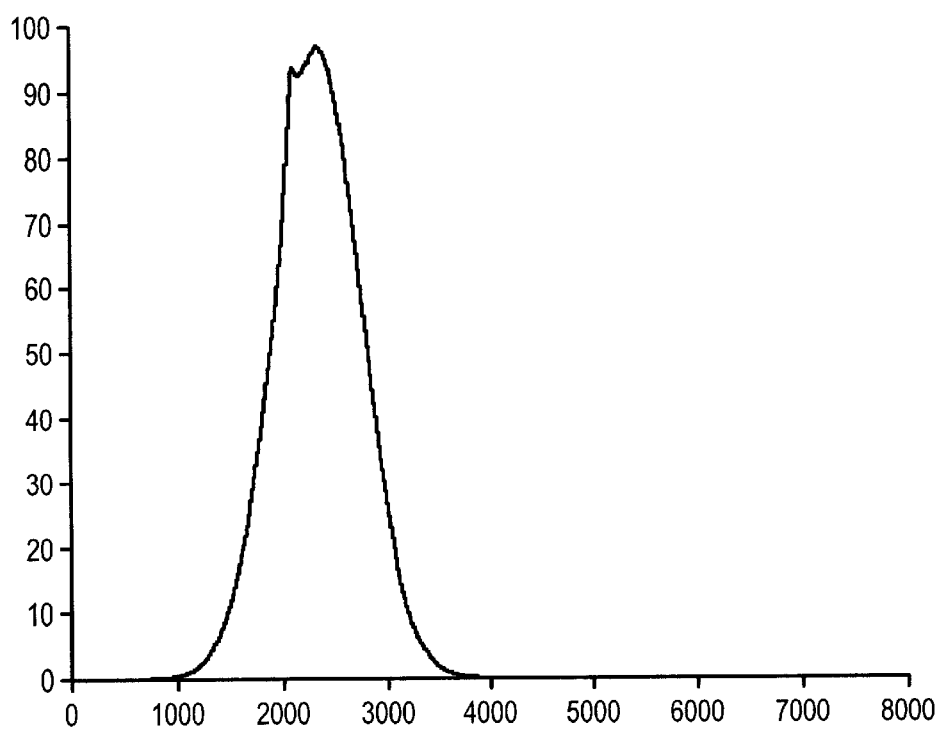
FIG. 19 is a graph illustrating a histogram obtained by low-pass filtering the histogram of FIG. 18.

For a simulated count distribution which is shown in FIG. 18 and is similar to that of FIG. 14 a filtering process has been applied using the uncorrected output code as the variable corresponding to time and the count corresponding to the instantaneous signal value as in signal filtering. A low-pass filter is used to remove the "high frequency" oscillations or the ripple and the resulting filtered signal is shown in FIG. 19. The program code used in the computer program Matlab is a follows:

c1=−0.96875;

c2=0.03125;

hny=filtfilt(c2,[1 c1],h_meas);

h_filt=filtfilt(c2,[1 c1],hny);

The filtered histogram can be used like the expected histogram as described above to calculate the relative errors for each uncorrected digital value and then finding correction terms.

Figure 20:
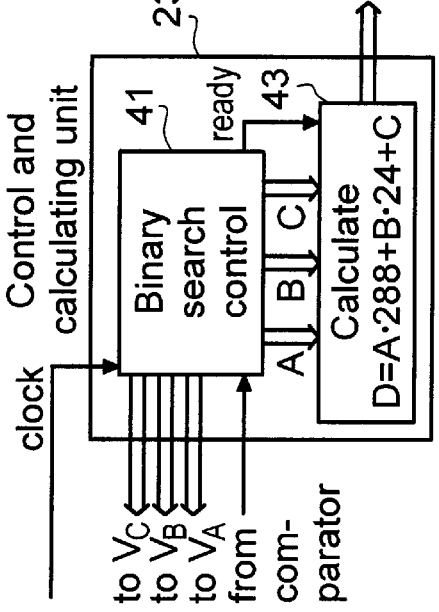
FIG. 20 is a block diagram of a control and calculating unit in a ADC according to prior art.

The logic control circuit 23 for the binary search and output word calculation, see FIG. 2, can in an ADC not using any correction as described above contain a unit 41 for the binary search control as depicted in FIG. 20. This unit issues signals to the reference generators generating the reference levels $V_C$, $V_B$, $V_A$, the issuing starting in response to a clock signal. The issued signals are changed in accordance with signals received from the comparator 21. After the signal from the comparator indicates that the combination of reference levels best agreeing with the sampled input value has been achieved, the found binary values of A, B, C are output to a calculating unit 43 together with a signal indicating to the calculating unit that the new values are available. The calculating unit will upon receiving that signal calculate the output word D according to Eq. (8) and deliver it as the output signal of the converter.

Figure 21:
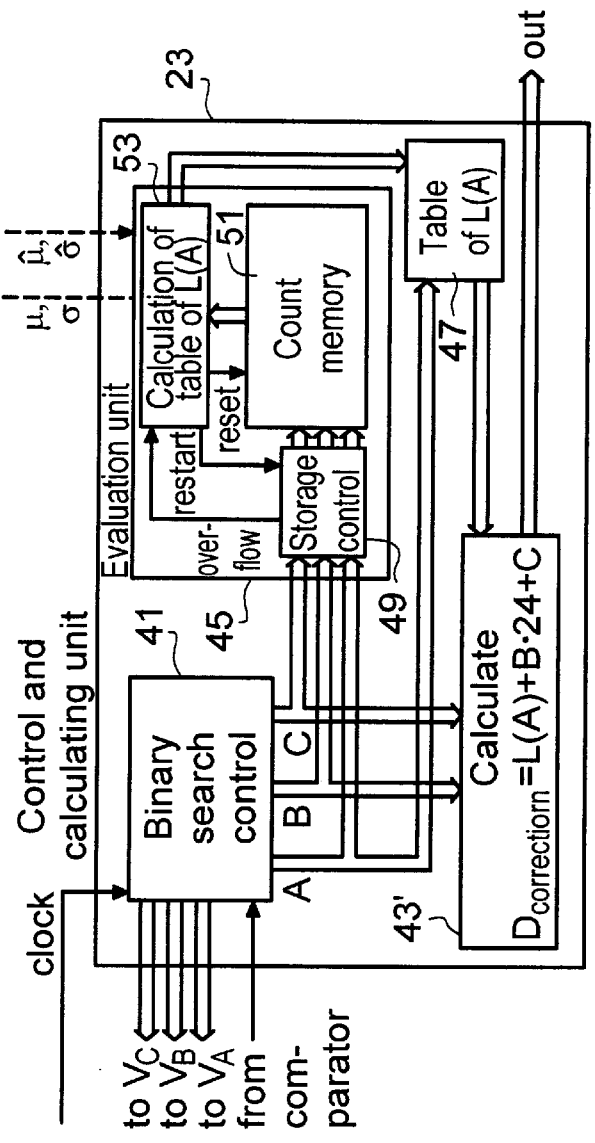
FIG. 21 is a block diagram of control and calculating unit in an ADC having static error correction.

A block diagram of a logic control circuit 23 for the binary search and output word calculation using correction as described above is shown in FIG. 21. The control circuit contains a unit 41 for the binary search control working as described with reference to FIG. 13. The found binary values of A, B, C are here output to an evaluation unit 45. The found binary values of B, C are also directly output to the calculating unit 43' but the found binary value A is deliver to unit or memory 47 holding a correction table L(A). When receiving the new binary value A the correction unit 47 forwards the value L(A) stored therein to the calculating unit. The calculating unit 43' will upon receiving the binary table value L(A) calculate the output word $D_{corrected}$ according to Eq. (12) and deliver it as the output signal of the converter.

In the evaluation unit 45 a storage control unit 49 receives the new found values A, B, C. They are evaluated for example by first calculating the quantity P and comparing it to predetermined boundary values. If it is decided that the digital value represented by the combination of the found A, B, C is to be counted, a memory cell in a count memory 51 is addressed for example by using A and P as row and column addresses in an array and the count the cell is incremented by one. When a sufficient number of counts have been made in the count memory 51, for example as signalled by overflow occurring in a memory cell when incrementing the count therein, the operation of the storage control is stopped so that no new combinations of found A, B, C are counted and a signal is fed to a unit 53 for calculation of the correction table L(A). The unit 53 then starts then calculation according to one of the methods described above. When the calculation is finished, the new correction table values L(A) are stored in the table unit 47, the count memory 51 is reset and signal is sent to the storage control 49 to again start incrementing the counts in the count memory 51. The correction table memory 47 can be reset after each start of the ADC or preferably it can be a non-volatile memory which is used when restarting the ADC.

Figure 22:
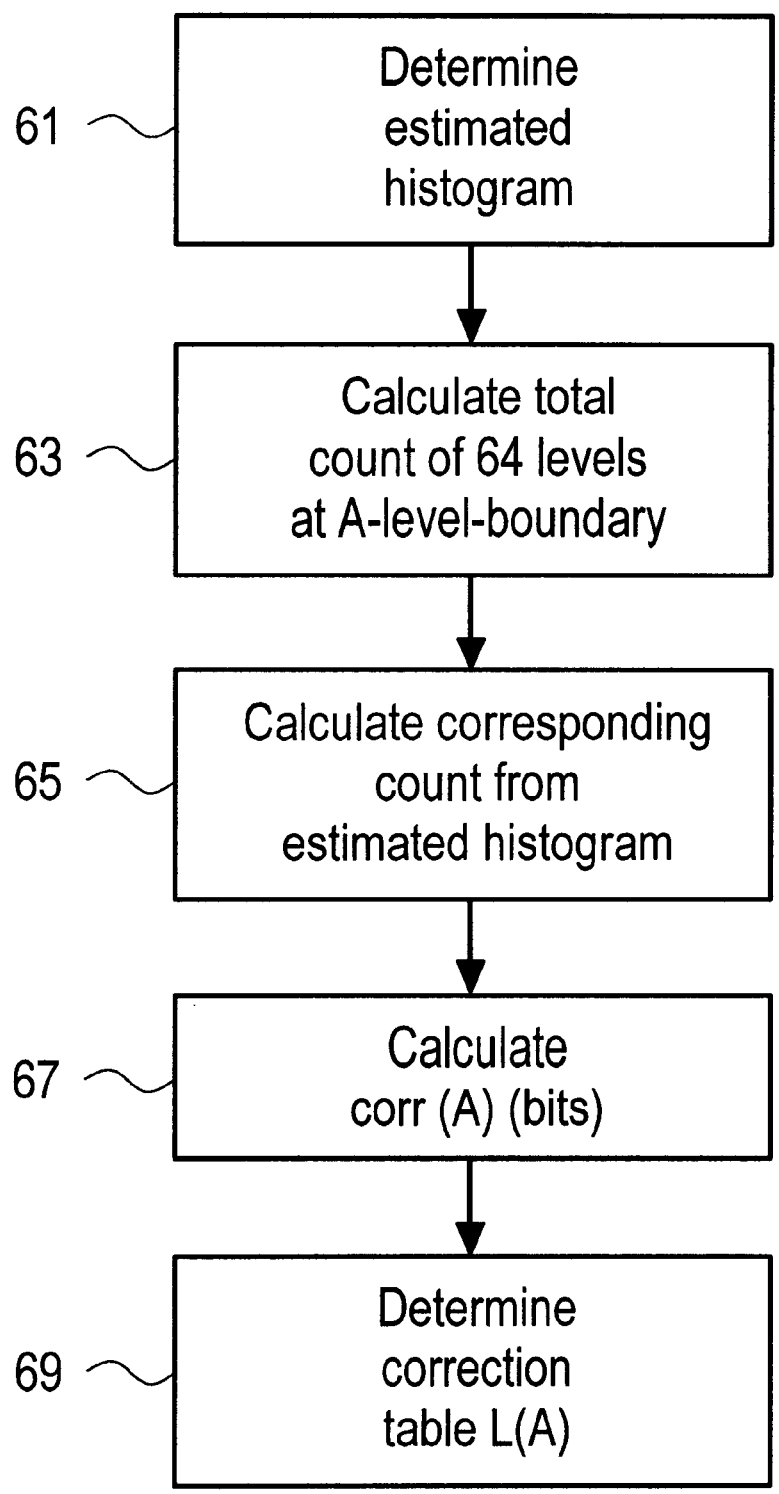
FIG. 22 is a flow diagram of steps performed by a calculation unit in the control and calculating unit of FIG. 21.

Thus, as has been described above, the unit will, after a sufficient number of converted samples have been counted in the memory 51, have new data L(A) for correction of the output values D as generated by the calculation unit 53. In addition to the condition of overflow of a count in a memory cell the calculation can be made such as only once at start-up or after reset of the ADC or periodically. A flow diagram of the steps used in the calculation is shown in FIG. 22.

In a first block 61 the estimated histogram $h_e$ is determined by evaluating the counted values in the array stored in the count memory 51. This can be done by e.g. one of the following methods:

1. estimating an expected distribution, e.g. a gaussian distribution, using counted values for all combinations (A,B,C) or (A,P).
2. estimating an expected distribution, e.g. a gaussian distribution, using counted values for only combinations (A,P) in a range at each A-level.
3. estimating an expected distribution, e.g. a gaussian distribution, using counted values for combinations (A,P) in a range well inside the A-interval above an A-level.
4. calculating the total count within a middle interval of each step of A and finding a smooth curve through the total counts by interpolation.
5. low-pass filtering the counts as a function of uncorrected output codes.

In the next block 63 the total count of the range at each A-level is calculated and then, in a block 65, the corresponding estimated total count is calculated from the estimated histogram. Thereupon, in a block 67 correction factors corr(A) are calculated from total counts and finally the correction table L(A) is created in a block 69, e.g. for relative correction factors, according to:

$$\Delta L(A) = (1 + corr(A)) \cdot span_A$$

where $span_A$ is the number of fine levels, i.e. the P-levels, corresponding to one A-level. In the embodiment described above, $span_A = 288$.

Alternatively the correction table can be created from $\Delta L(A) = \Sigma e$, where the sum is taken over a range of uncorrected digital values at the shift from A-1 to A.

Figure 23:
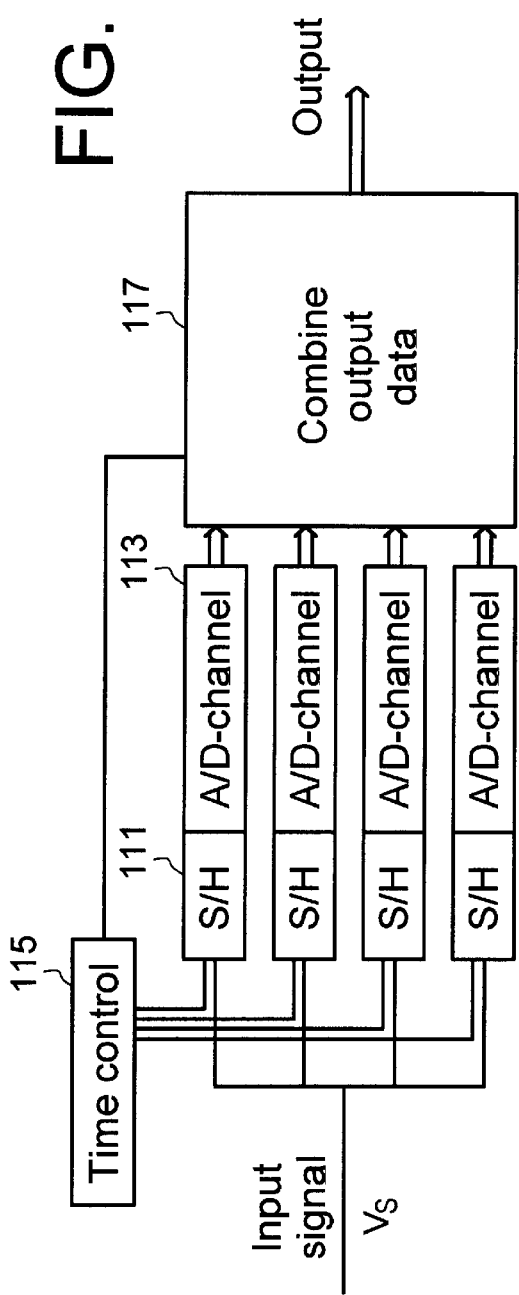
FIG. 23 is a block diagram of a parallel ADC device.

A single analog-to-digital converter can be too slow for some applications. Then, a plurality of single or individual ADCs, called ADC cells or ADC channels, are arranged which convert the successive sampled values in a cyclical process, the conversion in each cell being performed in parallel with or multiplexed in time with the conversion in the other cells, the conversion process starting at successive times for the successively sampled analog values. Such a composite device is called a parallel ADC device (PSA-ADC), see e.g. U.S. Pat. No. 5,585,796 for Christer M. Svensson et al. In FIG. 23 such a parallel ADC device having m parallel channels is schematically illustrated. The input analog signal $V_S$ is sampled by successively closing switches corresponding to the switch 19 in sample and hold circuits $111_1, 111_2, \ldots, 111_m$, one for each ADC cell $113_1, 113_2, \ldots, 113_m$, as controlled by clock signals from a time control unit 115, to make the instantaneous value of $V_S$ to be held or stored in the respective sample and hold circuit. The ADC cell connected to a sample and hold circuit compares the value held therein to reference values. The ADC cells deliver the output words on output lines to a multiplexer 117, from which a flow of digital words is obtained as an output of the total device.

Figure 24:
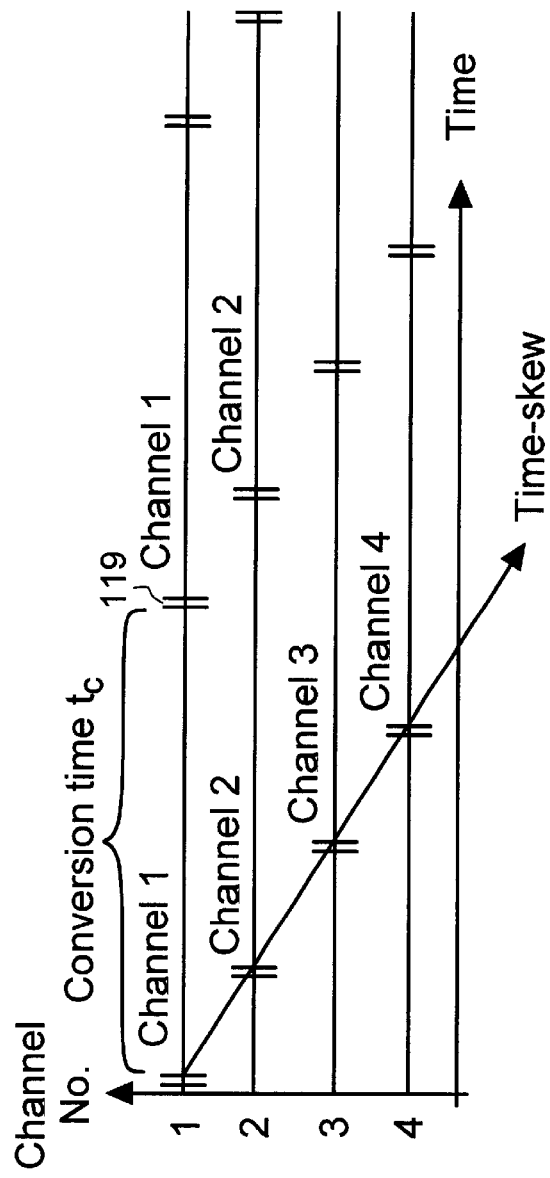
FIG. 24 is a diagram illustrating the conversion times of the cells in a parallel ADC device.

In FIG. 24 a timing diagram of the conversion process is shown. It is observed that for each ADC there is a time period of length $t_c$ in which the conversion of a sampled value is executed followed by a short intermediate time period indicated at 19. Each channel repeats the conversion process periodically with the same and fixed frequency, the time skew or time offset of the ADC cells being shown by the sloping line in FIG. 24.

In the correction procedure for static errors as described, there may appear an error accumulation owing to rounding errors in each ADC cell in a parallel ADC. The steps $\Delta_A$ are measured by the quantised scale P. The accuracy of P is expected to be 1 LSB. This error might obviously accumulate and can maximally result in a gain error of 16 LSB, i.e. 16/4096=0.4%. Thus a correction or balancing of the gain in each ADC channel may be required.

Also, the parallel ADC cells are designed to have equal reference levels using reference generators such as 11, 13 of the circuit shown in FIG. 2. Actually, these reference levels may differ and thus errors can exist. The errors include particularly errors in the general or average level of all reference levels which can be called offset errors and errors in the total conversion range, i.e. the range of the input signal, within which it will be converted, which errors can be called gain errors. Gain is defined to be in principle the ratio between range of the physical levels, in particular the coarse levels, in the reference generator and the codes in the correction table for A.

Each ADC cell can be provided with the feature of correcting static errors as described. In the correcting, a histogram is calculated and thus a measured distribution of uncorrected output values is obtained. In some way measures of the width of the distribution and the center of the distribution are produced. For example the standard deviation $\sigma_k$ and the average or mean $\mu_k$ can be calculated for the counts of each cell:

$$\hat{\sigma}_k = \left[ \frac{1}{N} \cdot \sum_{i=0}^{N-1} (D_k(i) - \mu_k)^2 \right]^{1/2} \tag{19}$$

$$\hat{\mu}_k = \frac{1}{N} \cdot \sum_{i=0}^{N-1} D_k(i) \tag{20}$$

These calculated values are particularly good estimates of the corresponding parameters ($\mu_k$, $\sigma_k$) in a gaussian distribution.

Instead of the standard deviation other width measures can be used such as the mean of the absolute value of the deviation of each output code as calculated from $$G_k = 1/N \cdot \Sigma |D - \mu_k| \tag{19'}$$

The offset and gain in each cell is then adjusted according to these measurements. An estimated means for the output signals of the total ADC device is given by, provided that the number N of digitized values is the same for all channels, $$\hat{\mu} = \frac{1}{k} \cdot \sum_{i=0}^{k-1} \hat{\mu}_k \tag{21}$$

The estimated standard deviation of all the values delivered by the ADC device is in the same way given by $$\hat{\sigma} = \frac{1}{k} \cdot \sqrt{\sum_{i=0}^{k-1} \hat{\sigma}_k^2} \tag{22}$$

An offset of each ADC cell is calculated from $$\textit{off}_k(0) = [-(\mu_k - \mu')] + const. \tag{23}$$

where the constant is some value used in order not to obtain negative values of $L_k(0)$. This offset is to be added to all the $L_k(A)$-values in the correction table for the considered ADC. After this, new correction $\Delta'L_k(A)$ for each step which are to be added to the already produced corrections $L_k(A)$ for each ADC are obtained from $$\Delta'L_k(A) = \left[ \frac{1}{\frac{\sigma_k - \hat{\sigma}}{\hat{\sigma}}} \cdot span_A \cdot A \right] \quad (24)$$

where $span_A$ as above is the number of fine levels, i.e. the P-levels, corresponding to one A-level. This last correction thus corrects for the possible inequality of the gain in each cell.

Figure 25:
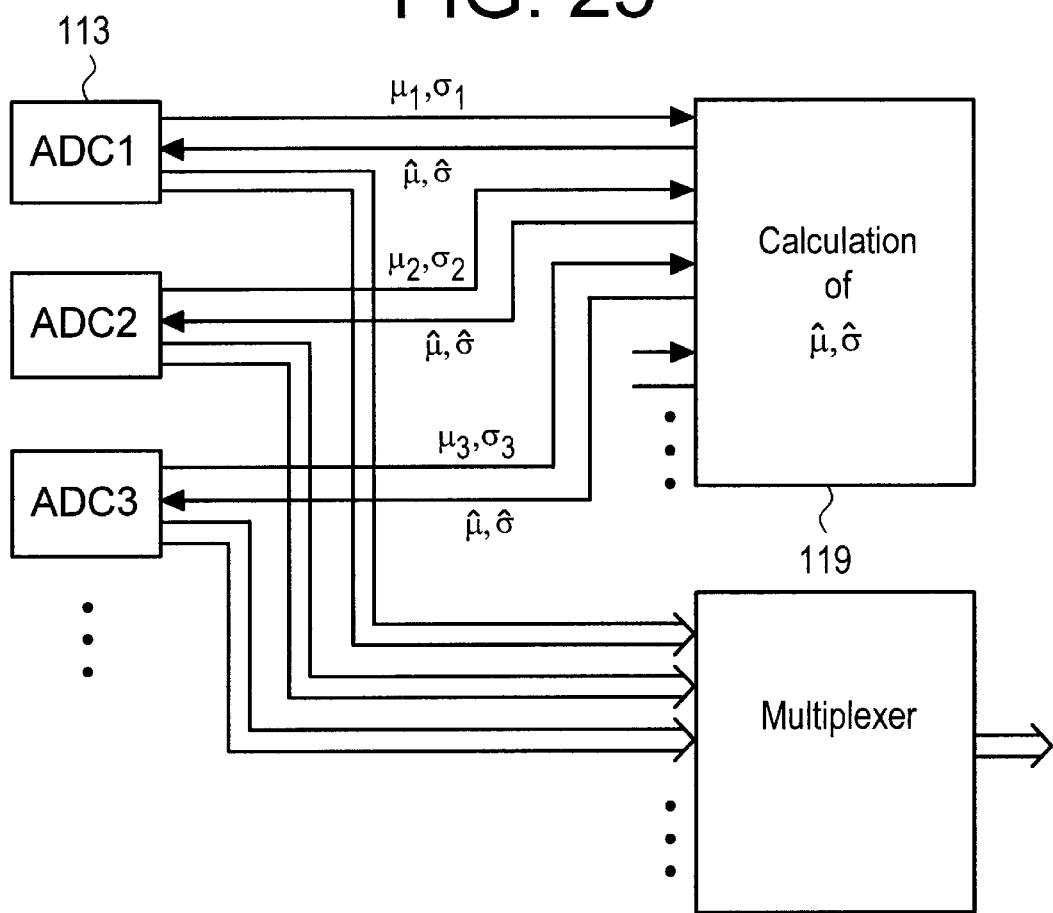
FIG. 25 is a block diagram showing part of a parallel ADC having gain and offset correction of cells.
Figure 26:
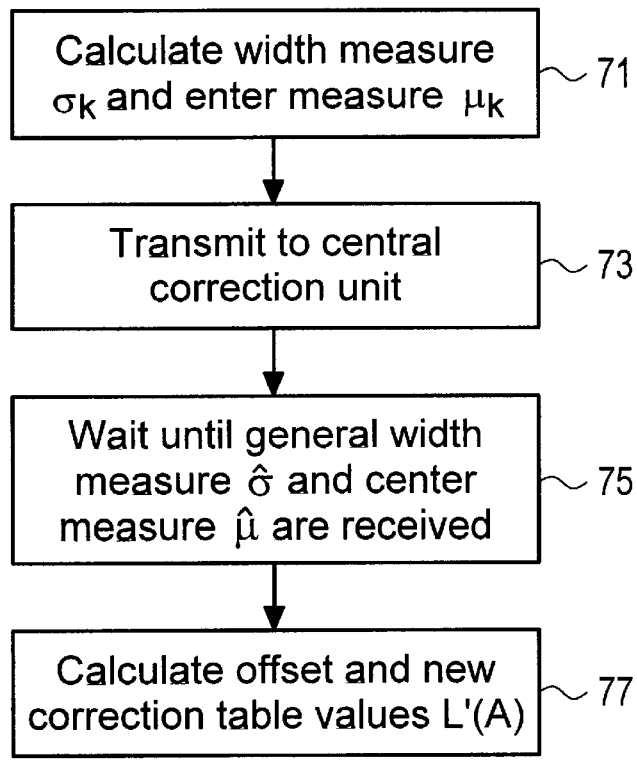
FIG. 26 is a flow diagram of additional steps performed by the calculation unit in the control and calculating unit in each cell of a parallel ADC for making gain and offset correction.

The parallel ADC as shown in FIG. 23 then has to be supplemented with a central correction unit 119 as seen in the block diagram of FIG. 25. From each ADC cell thus the center and width measures $\mu_k$ and $\sigma_k$ are provided to the central correction unit which calculates a general center measure $\hat{\mu}$ and a general width measure $\hat{\sigma}$. Then these values are fed to the evaluation units 45 of each ADC cell in which the units 53 for calculation the correction table make the final correction of the table. The additional steps to be executed by the units 53 are shown in the block diagram of FIG. 26. Here the center and width measures $\mu_k$ and $\sigma_k$ are calculated in a block 71 and are in the next block 73 provided to the central correction unit. In a block 75 the reception of the values the general center and width measures $\hat{\mu}$ and $\hat{\sigma}$ are awaited. After receiving them, in a block 77, the offset is calculated and finally the gain adjustment is calculated to produce the final correction table to be used when thereupon feeding converted values from the ADC.

Figure 27:
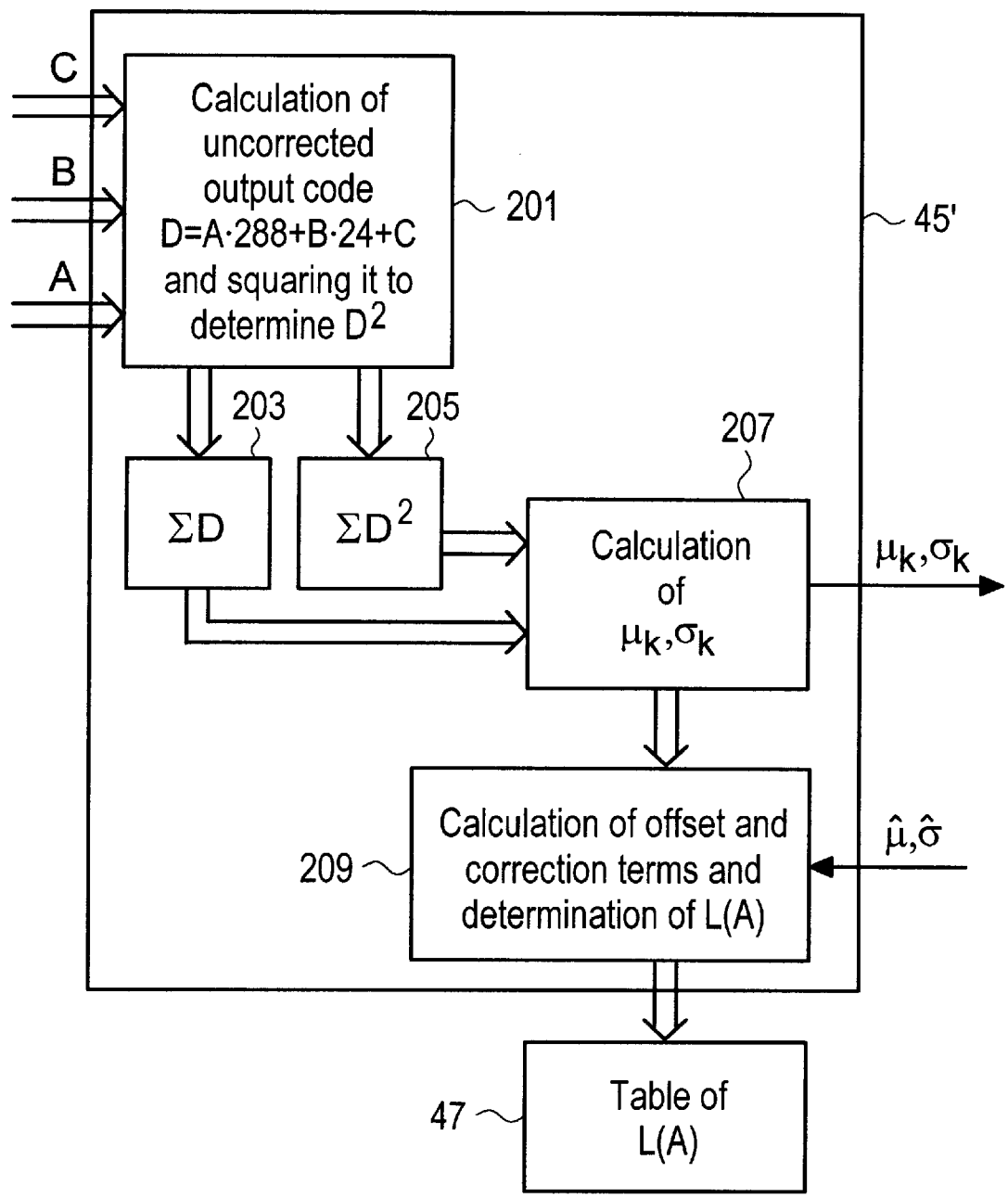
FIG. 27 is a block diagram of the calculation unit in the control and calculating unit in each cell of a parallel ADC for making gain and offset correction.

The method of correcting the offset and gain as described above can also be used in a parallel ADC in which the cells do not use the histogram based correction of static errors. In such an ADC cell, see FIG. 21, the original or initial $L(A)$ is created using equal steps, what is also made in the histogram based method. However, the evaluation unit 45 can be simplified and in particular there may be no large memory for counts. An evaluation unit 45' to be used in that case is shown by the block diagram of FIG. 27. When receiving the result of a comparison of an analog value, in a first calculation unit 201 the uncorrected digital output code is calculated such as in the above described example from $D=A\cdot288+B\cdot24+C$. This code is added to a sum of such codes stored in a first register 203. The code is also squared and is added to sum of such squares stored in a second register 205. After summing a for example predetermined, sufficient number of uncorrected codes and their squares, the summing is stopped and a second calculation unit 207 is activated. It calculates the average $\mu_k$ and the standard deviation $\sigma_k$ from the stored sums and transmits the calculated values to the central calculating unit 119. A third calculation unit 209 receives the calculated general mean and standard deviation $\hat{\mu}$ and $\hat{\sigma}$ and calculates therefrom a new offset and new correction terms $\Delta'L(A)$. The correction terms are added to the original $L(A)$-values valid for equal step heights to produce new $L(A)$-values which are finally stored in the table 47. Then the registers are reset and the summing process is started again.

If the distribution of the counted values can be considered to be constant in time, the method as described above for adjusting the gains of the cells of a parallel ADC can also be used for a single ADC cell. The width measure will then show only the accumulated error due to rounding and similar phenomena. A valid width measure can be determined from a very large number of counts corresponding to a plurality of the counts made for each new determination of the correction table $L(A)$ based on the histogram method.

Figure 28:
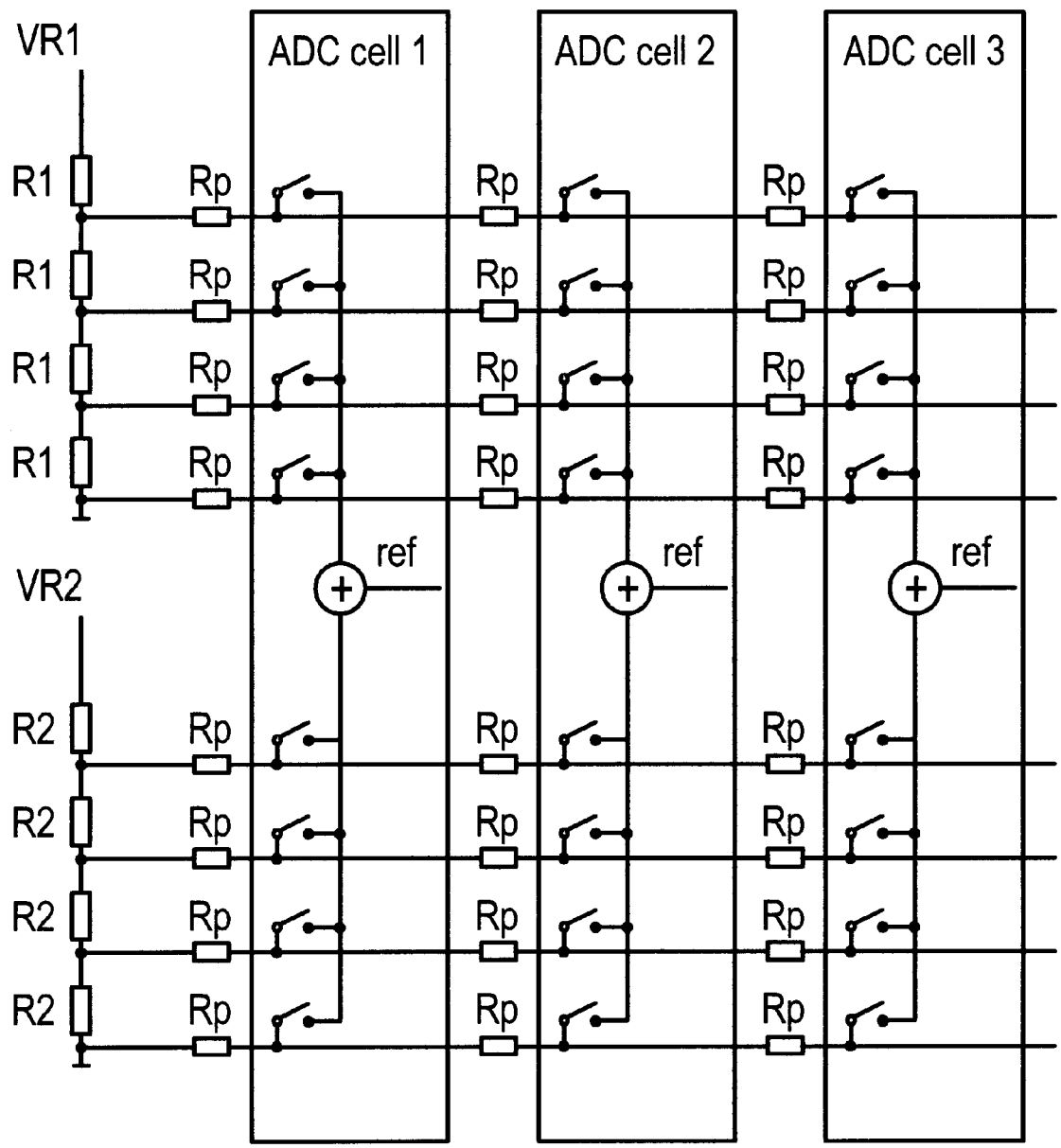
FIG. 28 is a circuit diagram of a common reference level generator for a parallel ADC.

In a parallel ADC the reference levels can be generated individually for each ADC cell or by a common reference generator as is disclosed in the cited U.S. patent for Christer M. Svensson et al. A circuit diagram of a common reference generator arrangement is shown in FIG. 28 for ADCs having 2+2 bits. Two reference voltages VR1, VR2 are applied to ladders of resistors R1 and R2 respectively, one reference voltage to each resistor ladder. From each connection point in the ladders lines having resistors Rp extend to the respective cell and are therein connected through switches to summing nodes ref which can be implemented as the summing node N of FIG. 2. $V_{Cunit}$ is then VR1/4 and $V_{Funit}$ is equal to VR2/4. The switches in each cell make the selection of a reference level to which the input signal is compared. Switching in cell 3 will causing ringing in cell 2 and in cell 1. For the reference generator for the most significant bits this is a large problem. The disturbance must be less than the required resolution. For the less significant bits, however, the resolution requirements are reduced and so are the disturbance requirements. Crosstalk is distributed in the lines.

The advantage of having a common reference generator obviously is that the gain in the different cells is matched or equal. The disadvantage is the coupling between the different cells through the reference wires, as discussed above. This coupling is code (signal) dependent and is most severe for the MSBs, for which the load is highest and the relative requirements are highest.

Figure 29:
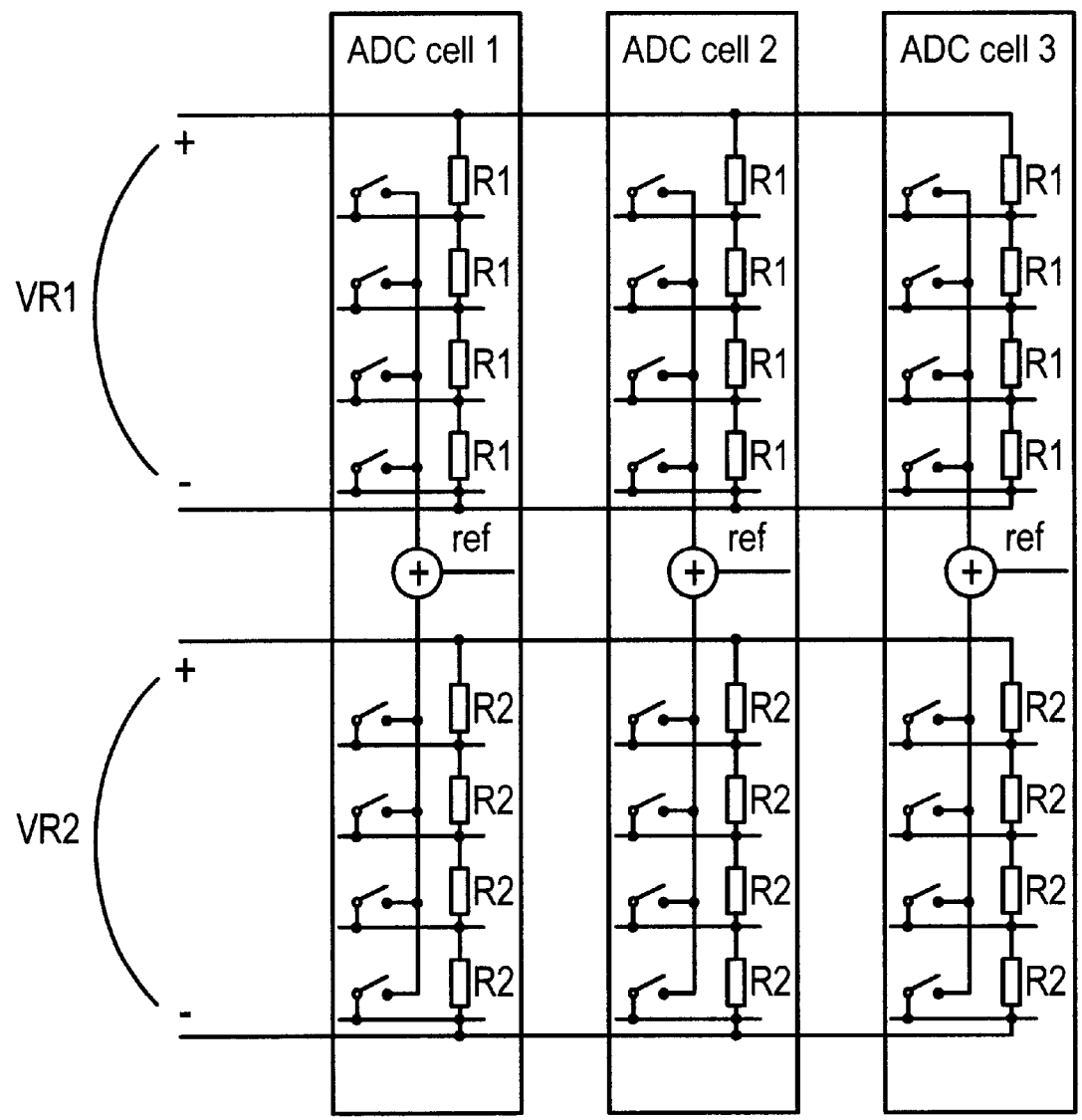
FIG. 29 is a circuit diagram of a reference level generator which is only partially common for a parallel ADC.

In a parallel ADC having separate, individual reference generators, one for each cell, there is no problem of coupling between the cells. The disadvantage of such an arrangement is that the circuit may be very large and that there might be a gain error, as has been discussed above. A circuit diagram of individual reference generators in a parallel ADC similar to that of FIG. 28 is shown in FIG. 29.

Figure 30:
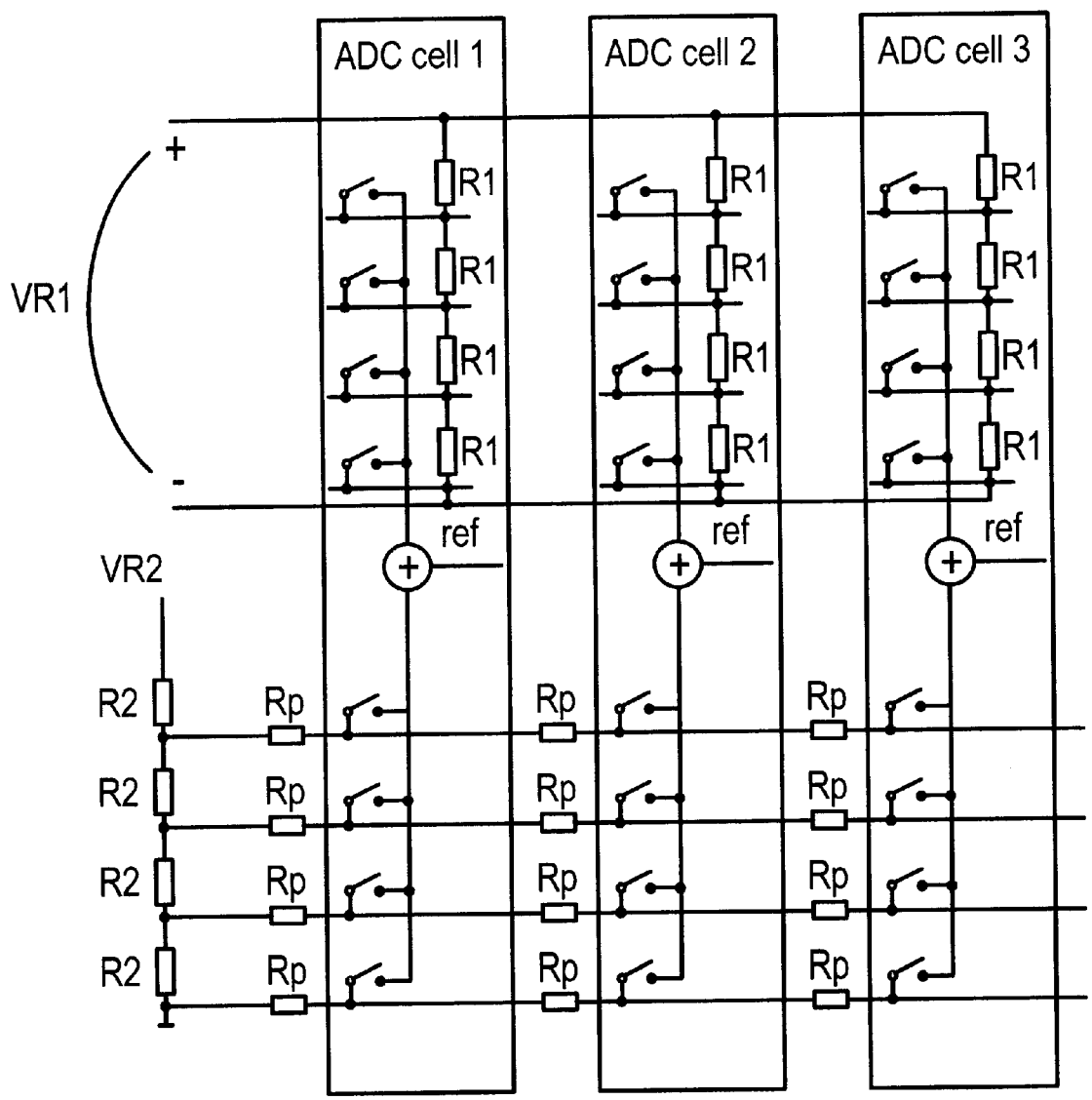
FIG. 30 is a circuit diagram of reference level generators being individual for each cell of a parallel ADC.

Since subranging is used in the cells, only the most significant part of the reference generator, i.e. the part that is used for finding A, can also be made individual to each cell. The correction terms for A is found from the common part of the reference generator and thus the gain is adjusted in the same way as the individual levels of A. A circuit diagram of an arrangement having individual reference generators for only the most significant bits in a parallel ADC and similar to that of FIGS. 28 and 29 is shown in FIG. 30. The two reference voltages VR1, VR2 are applied to ladders of resistors R1 and R2 respectively. One resistor ladder of resistors R1 is provided in each cell but the ladder of resistors R2 for the MSBs is common to all cells. In the resistor ladders individual to the cells no parallel resistors Rp are used.

In this way, the connection or coupling between cells is reduced. The supply wire for the reference voltage is still common for all cells, but it can be made with a lower impedance.

Figure 31:
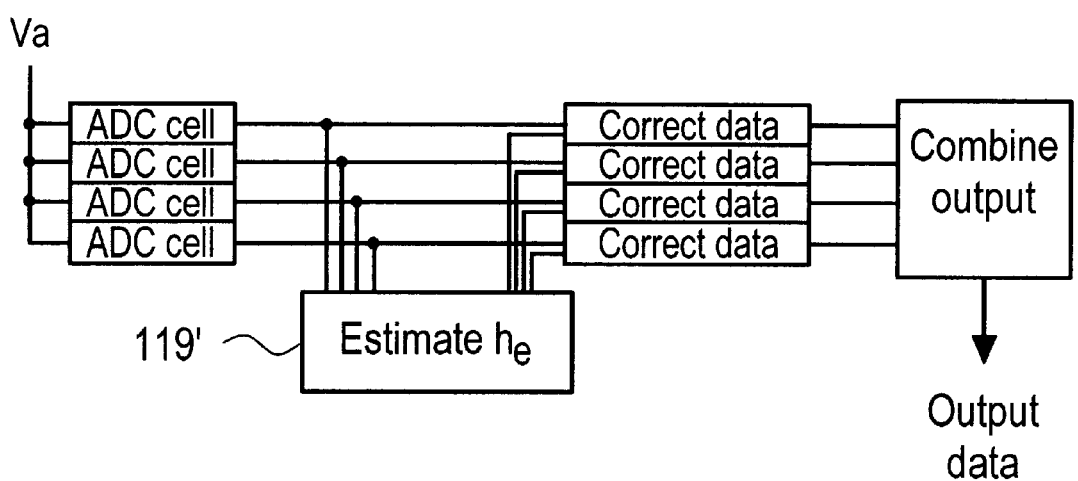
FIG. 31 is a block diagram illustrating a parallel ADC having a single calculating unit for calculating an estimated or filtered model distribution.

In a parallel ADC the expected histogram $h_e$ can be estimated using the counts from the entire ADC and then each cell be corrected individually. A block diagram of such an arrangement is shown in FIG. 31. The contents of the memories 51, see FIG. 21, used to store the counts for uncorrected output data will then all be used by the common calculation unit 119' for finding the expected histogram. The operation performed in the block 61 of FIG. 22 will then be made in the unit 119' and not in each ADC cell.

The error correction as described herein can also be used as a BIST (Built In Self Test). This is a standard procedure in digital circuits, but it can be difficult to implement it in analog circuits. The error correction procedure can by the above mentioned methods find some errors in the ADC. By analysing the measured histogram, conclusions on the ADC can be made.

Example 1. If the fine reference (codes B and/or C) is malfunctioning in such a way that it delivers only one or a few reference levels, groups of codes will be missing in the histogram measurements.

Assume a non-redundant (D=A·16·32+B·32+C) code: If C is only delivering 4 of its expected 32 codes, (32−4)/32= 7/8 of all codes will be missing.

For a redundant code (e.g. D=A·24·12+B·12+C): If C is only delivering 4 of its expected 24 unique codes, the number of missing codes depends on which 4 codes that are working, but the failure rate is between (24−4)/24=5/6 and 23/24.

These cases can be easily detected by a zero counter in the histogram logic. However, if the ADC has not been used, i.e. has not received any input signal, no values or counts are expected. Therefore, only zero counts between minimum and maximum of the present codes may be used for the detection.

Thus the following procedure can be executed. Measure the histogram as required for the error correction and then count the zeros in the appropriate interval. If an error is detected, an error flag is set or some similar indicator signalling an error.

Example 2. If the course reference (codes A) is failing, missing codes or has large deviations from expected values, the correction values in the table L(A) will deviate very much from the expected levels. This can be easily detected by a subtraction and a comparison (threshold circuit).

Example 3. If the analog circuitry, i.e. the comparator, is too slow, a specific pattern of missing codes will occur. The dynamic error correction is expected to handle this type of errors, but if the error is too large, due to the fact that the comparator is too slow or something else, the dynamic error correction will overflow.

This pattern can be detected. The pattern has a typical shape, but the exact shape can depend on the implementation. In principle the missing codes appear in groups on one side of some reference levels. The groups are larger and more probable at the levels corresponding to the more significant bits.

To determine the pattern, some sample can be taken out of the production of ADC circuits and it is checked what happens in this specific design. Then a program is loaded into all other circuits, which tells the pattern to look for.

Another way is to assume that the dynamic error correction is overdimensioned. Then an overflow in the dynamic error correction can be detected as e.g. in the example above B=15 and C=31 for the same sample. Underflow is detected as B=0 and C=0 for the same sample. If the over/underflow is frequent, the circuit is malfunctioning.

In the description of the histogram based correction methods only the coarsest reference levels, i.e. the A-values, are corrected. Obviously, some of correction methods can be used also to the correct the next to coarsest reference levels, i.e. the B-values, using the redundant C-values, and so on up to the next finest reference levels. It is not necessary to use the same correction method in the different cases.

A histogram based matching calibration method has thus been described allowing that the static matching requirements can be relaxed. The calibration technique is completely digital. The extra latency is low, since the real-time correction is look-up table based. The calibration initially requires some time corresponding to the conversion time of a magnitude of order of $10^7$ samples to acquire enough data for the calibration.

While specific embodiments of the invention have been illustrated and described herein, it is realized that numerous additional advantages, modifications and changes will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents. It is therefore to be understood that the appended claims are intended to cover all such modifications and changes as fall within a true spirit and scope of the invention.

What is claimed is:

1. A method of determining digital values from analog values successively sampled from an analog signal, the method comprising the steps of:

provided a sequence of reference values, each of the reference values having an order number, for each of the sampled analog values:

comparing the sampled analog value to the reference values to determine a reference value best agreeing with the sampled analog value, and determining, from the order number of the determined reference value, an uncorrected digital value representing the sampled analog value, during a predetermined time period or for a predetermined number of sampled analog values, counting occurrences of at least some of the uncorrected digital values, after having counted the occurrences:

calculating from the counted occurrences a model distribution of occurrences of the uncorrected digital values to provide model occurrences of the digital values, and comparing the counted occurrences to the model occurrences, for each of the analog values sampled after having made the comparing, in the step of determining, determining a corrected digital value from the order number of the determined reference value and the result of the comparing of the counted and model occurrences, the corrected digital value representing the sampled analog value with the same or a higher accuracy than the uncorrected digital value.

2. The method of claim 1, wherein in the step of calculating a model distribution, the counted occurrences as a function of the uncorrected digital values are estimated to provide an expected distribution which is taken to be the model distribution.

3. The method of claim 1, wherein in the step of calculating a model distribution, the counted occurrences as a function of the uncorrected digital values are low-pass filtered to provide the model distribution.

4. The method of claim 1, wherein in the step of calculating a model distribution, predetermined ones of the counted occurrences are summed to provide summed occurrences, from which a model distribution is calculated by interpolation.

5. The method of claim 1, wherein in the step of providing a sequence of reference values, a first subsequence of coarse reference values and a second subsequence of fine reference values are provided, each of the course reference values having an order number and each of the coarse reference values having an order number, and in the step of determining, that one of the coarse reference values and that one of the fine reference values which when added to each other give a value having the smallest deviation from the sampled value is determined, and the order numbers of the determined coarse reference value and fine reference value are combined or added to each other to give the uncorrected and corrected digital values representing the sampled analog signal.

6. The method of claim 1 performed by a conversion device, the method comprising the additional step of making a self test of the conversion device using the counted occurrences.

7. The method of claim 6, wherein in the step of making the self test at least one selected among the following is made:

counting zeros among the counted occurrences, detecting too large control signals, detecting a predetermined pattern, measuring the correlation with the model distribution, training the conversion device to detect a specific pattern and in particular loading a program, and detecting over-/underflow in a dynamic error correction procedure.

8. A method of correcting static errors in an analog-to-digital converter receiving analog values successively sampled from an analog signal and providing uncorrected digital values representing the sampled analog values, the method comprising the steps of:

during a predetermined time period or for a predetermined number of sampled analog values, counting occurrences of at least some of the uncorrected digital values, after having counted the occurrences:

calculating from the counted occurrences a model distribution of the occurrences of the uncorrected digital values to provide model occurrences of the uncorrected digital values, and comparing the counted occurrences to the model occurrences, for each of the analog values sampled after having made the comparing, using the result of the comparing to correct the uncorrected digital value to provide a corrected digital value more accurately representing the sampled analog value than the uncorrected digital value.

9. The method of claim 8, wherein in the step of calculating a model distribution one of:

an expected distribution, a filtered distribution, and an interpolated distribution is calculated.

10. The method of claim 8, wherein in the step of calculating a model distribution an expected distribution is calculated which is taken to be one of a family of similar distributions, each member of the family defined by at least one parameter, and determining said at least one parameter from the counted occurrences.

11. The method of claim 8, wherein in the step of counting the occurrences, only the occurrences of uncorrected digital values located within predetermined intervals are counted, the predetermined intervals located around break points in the range of uncorrected digital values.

12. The method of claim 11, the method comprising the additional step of making a self test of the analog-to-digital converter using the counted occurrences.

13. The method of claim 12, wherein in the step of making the self test at least one selected among the following is made:

counting zeros among the counted occurrences, detecting too large control signals, detecting a predetermined pattern, measuring the correlation with the model distribution, training the analog-to-digital converter to detect a specific pattern and in particular loading a program, and detecting over-/underflow in a dynamic error correction procedure.

14. A method of determining digital values from analog values successively sampled from an analog signal, the method comprising the steps of:

providing a first sequence of coarse reference values and a second sequence of fine reference values, each of the course reference values having an order number and each of the course reference values having an order number, for each of the sampled analog values:

comparing the sampled analog value to the coarse reference values of the first sequence and to the fine reference value of the second sequence, determining that one of the coarse reference values and that one of the fine reference values which when added to each other give a value having the smallest deviation from the sampled analog value, and combining or adding the order number of the determined coarse reference value and the order number of the determined fine reference value to give a digital value representing the sampled analog signal, storing, for a plurality of successively sampled analog values, counts of occurrences of each pair of a coarse reference value and a fine reference value determined from the successively sampled analog values, determining from the stored counts a model distribution of the counts, comparing the counts of the pairs of a first one of the coarse reference levels and the fine reference levels at an upper boundary of the sequence of fine reference levels and the counts of the pairs of a second one of the coarse reference levels located directly above said first one of the coarse reference levels and the fine reference levels at the lower boundary of the sequence of fine reference levels to counts for the same pairs calculated from the model distribution, determining from the result of the comparing correction terms, and for each analog value sampled after having determined the correction terms, combining or adding a respective one of the determined correction terms and the combined or added digital value representing the sampled analog value to give a corrected digital value representing the sampled analog signal.

15. The method of claim 14, wherein in the step of determining from the stored counts a model distribution, one selected among:

an expected distribution, a filtered distribution, and an interpolated distribution is determined.

16. The method of claim 14, wherein in the step of determining correction terms, each of the correction terms is determined by summing the respective counts, finding a relative deviation of the sum of stored counts from the sum of estimated counts and multiplying the number of levels in the sequence of fine reference levels by the relative deviation.

17. The method of claim 14, wherein in the step of determining that one of the coarse reference values and that one of the fine reference values which when added to each other give a value having the smallest deviation from the sampled value, the adding is made with a negative offset, so that for adding a coarse reference value to at least the lowest fine reference value an offset sum is obtained which is lower than said coarse reference value.

18. The method of claim 14, wherein in providing the first and second sequences, the first and second sequences are provided with redundancy so that when adding one of the coarse reference values to at least the highest of the fine reference values a result value higher than or equal to the coarse reference value located next higher than said one of the coarse reference values.

19. The method of claim 14 performed by a conversion device, the method comprising the additional step of making a self test of the conversion device using the stored counted occurrences.

20. The method of claim 19, wherein in the step of making the self test at least one selected among the following is made:
   counting zeros among the counted occurrences,
   detecting too large control signals,
   detecting a predetermined pattern,
   measuring the correlation with the model distribution,
   training the conversion device to detect a specific pattern and in particular loading a program, and
   detecting over-/underflow in a dynamic error correction procedure.

21. A converter for determining digital values from analog values successively sampled from an analog signal, the converter comprising:
   a reference level generator providing a sequence of reference values, each of the reference values having an order number,
   a comparator for comparing each sampled analog value to reference values obtained from the reference level generator to determine a reference value best agreeing with the sampled analog value,
   first calculation means for determining, from the order number of the reference value determined for each one of the sampled analog values, an uncorrected digital value representing the sampled analog value,
   memory means connected for storing counts of the occurrences of at least some of the uncorrected digital values,
   means connected to the calculation means for incrementing, when receiving an uncorrected digital value for which a count is stored in the memory means, the stored count of the occurrence of the uncorrected digital value,
   second calculation means connected to the memory means for calculating from the stored counts of occurrences a model distribution of occurrences of the uncorrected digital values to provide model occurrences of the uncorrected digital values,
   comparing means connected to the memory means and the second calculation means for comparing the stored counts of occurrences to the model occurrences,
   the first calculation means connected to the comparing means and arranged to use, for each one of the sampled analog values, both the order number of the reference value determined for the sampled analog value and the result of the comparing of the counted and model occurrences made by the comparing means to determine a corrected digital value representing the sampled analog value more accurately than the uncorrected digital value.

22. The device of claim 21, wherein the second calculating means in calculating the model distribution are arranged to estimate the model occurrences as a function of the uncorrected digital values to provide an expected distribution taken to be the model distribution.

23. The device of claim 21, wherein the second calculating means are arranged to low-pass filter the stored counts of occurrences as a function of the uncorrected digital values to provide the model distribution.

24. The device of claim 21, wherein the second calculating means are arranged to sum predetermined ones of the stored counts of occurrences to provide summed occurrences and to interpolate from the summed occurrences the model distribution.

25. The device of claim 21, wherein
   the reference level generator is arranged to generate a first subsequence of coarse reference values and a second subsequence of fine reference values,
   the comparator is arranged, when determining the best agreeing reference value, to determine that one of the coarse reference values and that one of the fine reference values which when added to each other give a value having the smallest deviation from or agreeing best with the sampled value,
   the first calculation means are arranged to combine or add, when determining from the order number of the determined reference value an uncorrected digital value, the order numbers of the determined coarse reference value and fine reference value as placed in the first and second sequences respectively to give the digital value representing the analog signal.

26. A device for correcting static errors in an analog-to-digital converter, the device comprising:
   memory means for storing counts of the occurrences of at least some of uncorrected digital values which are output from the analog-to-digital converter and represent analog values sampled from an input signal,
   means connected to the memory means and to an output of the analog-to-digital converter for incrementing, during a predetermined time period, at each time when the analog-to-digital converter outputs an uncorrected digital value for which a count is stored in the memory means, the count of the uncorrected digital value,
   calculation means for calculating from the stored counts of occurrences an expected distribution of occurrences of the uncorrected digital values to provide model occurrences of the digital values,
   comparing means connected to the memory means and the calculation means for comparing the stored counts of occurrences to the model occurrences,
   a correction unit connected to the comparing means and using, after the time period, the result of the comparing made by the comparing to correct uncorrected digital values output from the converter to provide corrected digital values which more accurately represent the sampled analog values than the uncorrected digital values.

27. The device of claim 26, wherein the calculation means, in calculating an expected distribution, are arranged to calculate one of: an estimated, a low-pass filtered and an interpolated distribution.

28. The device of claim 26, wherein the calculating means are arranged to estimate an expected distribution of a family of similar distributions, each member of the family defined by at least one parameter, and to determine said at least one parameter from the stored counts of occurrences.

29. The device of claim 26, wherein in the memory means only the occurrences of uncorrected digital values within predetermined intervals are stored, the predetermined intervals located around break points in the range of uncorrected digital values.

30. A device for determining digital values from analog values successively sampled from an analog signal, the device comprising:
- a reference level generator to provide a first sequence of coarse reference values and a second sequence of fine reference values,
- a comparator for comparing a sampled analog value to the coarse reference values of the first sequence and to the fine reference values of the second sequence,
- means for determining that one of the coarse reference values and that one of the fine reference values which when added to each other give a value having the smallest deviation from the sampled analog value,
- calculation means for combining or adding order numbers of the determined coarse reference value and fine reference value as placed in the first and second sequences respectively to give a digital value representing the analog signal,
- memory and counting means for storing, for a plurality of successively analog values, the number of occurrences of the order numbers of the determined coarse reference value and fine reference value to give counts for each pair of the order number of a coarse reference value and of the order number of fine reference value,
- means for determining from the stored counts a model distribution of counts,
- comparing means for comparing the counts of the pairs of a first coarse reference level and fine reference levels at the upper boundary of the sequence of fine reference levels and the counts of the pairs of the coarse reference level directly above the first coarse reference level and fine reference levels at the lower boundary of the sequence of fine reference levels to counts for the same pairs calculated from the model distribution,
- means connected to the comparing means for determining from the result of the comparing a correction term to be added, after determining the order numbers for a sampled analog value, to the sum of the order numbers of a determined coarse reference value and a determined fine reference value to give a digital value representing the sampled analog signal, from which the values were determined.

31. The device of claim 30, wherein the means for determining from the stored counts a model distribution of counts, are arranged to determine one of: an estimated, a filtered and an interpolated distribution.

32. The device of claim 30, wherein the means for determining the correction term are arranged to determine the correction term by summing the respective counts, finding the relative deviation of the sum of stored counts from the sum of estimated counts and multiplying the number of levels in the sequence of fine reference levels by the relative deviation.

33. The device of claim 30, wherein the comparator, when determining that one of the coarse reference values and that one of the fine reference values which when added to each other give a value having the smallest deviation from the sampled value, are arranged to make the adding with a negative offset, so that for adding a coarse reference value to at least the lowest fine reference value an offset sum is obtained which is lower than said coarse reference value.

34. The device of claim 30, wherein the reference level generator is arranged to provide the first and second sequences the sequences with redundancy so that the comparator, when adding one of the coarse reference values to at least the highest of the fine reference values a result value higher than or equal to the coarse reference value located next higher than said one of the coarse reference values.

35. A parallel converter device comprising a plurality of element devices of claim 21 working in parallel for determining digital values from analog values successively sampled from an analog signal, wherein the second calculation means are common to all element devices and are connected to the memory means of all element devices for calculating from the counted occurrences in all the memory means the model distribution.

36. A parallel converter device comprising a plurality of element converter devices working in parallel for determining digital values from analog values successively sampled from an analog signal, each element device arranged to provide uncorrected digital values representing sampled analog values, the parallel converter device further comprising:
- first calculation means connected to receive the uncorrected digital values and arranged to calculate a center measure and a width measure of the distribution of the uncorrected digital values for each element device and for all the uncorrected digital values, and
- in each element device:
  - comparing means connected to the first calculation means for comparing the center and width measures to the center and width measures for all values,
  - a correction table for storing corrections,
  - second calculation means connected to the comparing means and the correction table for calculating, based on the result of the comparing, in particular on the difference of the measures, corrections stored in the correction table,
  - correction means connected to the correction table and connected to receive the uncorrected digital values and determining from the uncorrected digital values and the corrections corrected digital values which represent the sampled analog values more accurately than the uncorrected digital values.

37. The parallel converter device of claim 36, wherein the second calculation means when calculating the corrections are arranged to determine corrections for gain and/or offset in the element device.

38. A parallel converter device comprising a plurality of element converter devices working in parallel for determining digital values from analog values successively sampled from an analog signal, a comparator included in each element device to compare sampled analog values to sequence of reference values obtained from a subsequence of coarse reference values and a subsequence of fine reference levels, as generated by a reference level generator, wherein the subsequence of coarse reference levels is generated by parts of the reference level generator which are individual to each element device and that the subsequence of fine reference levels is generated by a single part of the reference level generator which is common to all element devices.

* * * * *